(12) United States Patent
Rafferty et al.

(10) Patent No.: US 8,294,100 B2
(45) Date of Patent: Oct. 23, 2012

(54) IMAGING APPARATUS AND METHODS

(75) Inventors: Conor S. Rafferty, Newton, MA (US);
Anders Ingvar Aberg, Winchester, MA (US); Tirunelveli Subramaniam Sriram, Acton, MA (US); Bryan D. Ackland, Old Bridge, NJ (US); Clifford A. King, Gloucester, MA (US)

(73) Assignee: Infrared Newco, Inc., Tucson, AZ (US)

( * ) Notice: Subject to any disclaimer, the term of this patent is extended or adjusted under 35 U.S.C. 154(b) by 0 days.

(21) Appl. No.: 13/299,712

(22) Filed: Nov. 18, 2011

(65) Prior Publication Data

US 2012/0061567 A1 Mar. 15, 2012

Related U.S. Application Data

(63) Continuation of application No. 12/504,005, filed on Jul. 16, 2009, now Pat. No. 8,084,739.

(60) Provisional application No. 61/081,175, filed on Jul. 16, 2008.

(51) Int. Cl.
*H01L 25/00* (2006.01)
(52) U.S. Cl. ....................................... 250/332
(58) Field of Classification Search ............. 250/332
See application file for complete search history.

(56) References Cited

U.S. PATENT DOCUMENTS

| 3,971,065 | A | | 7/1976 | Bayer |
| 4,061,916 | A | * | 12/1977 | King et al. ............. 250/332 |
| 4,238,760 | A | | 12/1980 | Carr |
| 4,677,289 | A | | 6/1987 | Nozaki et al. |
| 4,772,933 | A | | 9/1988 | Schade |
| 5,447,117 | A | | 9/1995 | Yonebara et al. |
| 5,467,204 | A | | 11/1995 | Hatano et al. |
| 5,497,269 | A | | 3/1996 | Gal |
| 5,512,750 | A | | 4/1996 | Yanka et al. |
| 5,965,875 | A | | 10/1999 | Merrill |
| 6,864,557 | B2 | | 3/2005 | Turner et al. |
| 6,897,498 | B2 | | 5/2005 | Gothoskar et al. |

(Continued)

FOREIGN PATENT DOCUMENTS

WO WO 2004/008537 A2 1/2004

OTHER PUBLICATIONS

Ackland et al., "Camera on a Chip," (Digest of Technical Papers), *IEEE Int'l. Solid-State Circuits Conference*, Session 1/Plenary Session/Paper TA 1.2, pp. 22-25 and 412 (1996).

(Continued)

*Primary Examiner* — David Porta
*Assistant Examiner* — Hugh H Maupin
(74) *Attorney, Agent, or Firm* — Wolf, Greenfield & Sacks, P.C.

(57) ABSTRACT

Imagers, pixels, and methods of using the same are disclosed for imaging in various spectra, such as visible, near infrared (IR), and short wavelength IR (SWIR). The imager may have an imaging array having pixels of different types. The different types of pixels may detect different ranges of wavelengths in the IR, or the SWIR, spectra. The pixels may include a filter which blocks some wavelengths of radiation in the IR spectrum while passing other wavelengths. The filter may be formed of a semiconductor material, and therefore may be easily integrated with a CMOS pixel using conventional CMOS processing techniques.

10 Claims, 19 Drawing Sheets

U.S. PATENT DOCUMENTS

| | | | |
|---|---|---|---|
| 7,012,314 | B2 | 3/2006 | Bude et al. |
| 7,149,366 | B1 | 12/2006 | Sun |
| 7,218,348 | B2 | 5/2007 | Misawa |
| 7,453,129 | B2 | 11/2008 | King et al. |
| 7,566,875 | B2 | 7/2009 | Starikov et al. |
| 7,643,755 | B2 | 1/2010 | Rafferty et al. |
| 7,883,925 | B2 | 2/2011 | Kim |
| 2002/0039833 | A1 | 4/2002 | Bensahel et al. |
| 2003/0013218 | A1 | 1/2003 | Chason |
| 2003/0020099 | A1 | 1/2003 | Taylor |
| 2004/0108564 | A1 | 6/2004 | Mitra |
| 2004/0119129 | A1 | 6/2004 | Giboney |
| 2005/0088653 | A1 | 4/2005 | Coates et al. |
| 2005/0104089 | A1 | 5/2005 | Engleman et al. |
| 2005/0285038 | A1 | 12/2005 | Frangioni |
| 2006/0055800 | A1 | 3/2006 | Ackland et al. |
| 2009/0072284 | A1 | 3/2009 | King et al. |
| 2010/0019154 | A1 | 1/2010 | Rafferty et al. |

OTHER PUBLICATIONS

Bai et al., "Development of Hybrid CMOS Visible Focal Plan Arrays at Rockwell," Infrared Detectors and Focal Plane Arrays VI, *Proc. SPIE*, vol. 4028, pp. 174-182 (2000).

Colace et al., "A Near-Infrared Digital Camera in Polycrystalline Germanium Integrated on Silicon," *IEEE J. Quantum Electronics* 43(4):311-315 (Apr. 2007).

Colace et al., "Efficient High-Speed Near-Infrared Ge Photodetectors Integrated on Si Substrates," *Appl. Phys. Letters* 76(10):1231-1233 (2000).

Henker et al., "Concept of Color Correction on Multi-Channel CMOS Sensors," Digital Image Computing: Techniques and Applications, *Proc. VIIth Biennial Australian Pattern Recognition Society Conferences—DICTA*, vol. 2, pp. 771-780 (2003).

Feb. 28, 2008 International Preliminary Report on Patentability with Nov. 7, 2007 Written Opinion and May 8, 2008 International Search Report for International Patent Application No. PCT/US2006/031591.

Scribner et al., "Melding Images for Information," *SPIE OE Magazine*, 2(9):24-26 (Sep. 2002).

Orcutt et al., "Characterization and Performance Analysis of LPCVD Germanium-on-Silicon C-Band Photodiodes," *Photonics in Switching* Aug. 19-22, 2007, San Francisco, CA, pp. 92-94.

\* cited by examiner

IMAGING APPARATUS AND METHODS

RELATED APPLICATIONS

This application claims the benefit as a continuation under 35 U.S.C. §120 of U.S. patent application Ser. No. 12/504,005 filed Jul. 16, 2009 and entitled "Imaging Apparatus and Methods" which is incorporated herein by reference in its entirety.

U.S. patent application Ser. No. 12/504,005 claims the benefit under 35 U.S.C. §119(e) of U.S. Patent Application Ser. No. 61/081,175 filed Jul. 16, 2008 and entitled "Imaging Apparatus and Methods," which is incorporated herein by reference in its entirety.

BACKGROUND

1. Field

The technology described herein relates to optical detection systems.

2. Related Art

Solid state image sensors, often referred to as "imagers," detect incident radiation and produce, or provide, an image based on the detected radiation. A typical imager comprises a two-dimensional array of photodetectors (referred to as a focal plane array, or an imaging array) in combination with a readout integrated circuit (ROIC). The photodetectors are sensitive to (i.e., detect) incoming radiation and produce an output signal (referred to as a "photoresponse") based on the detected radiation. The ROIC scans and quantitatively evaluates the outputs from the photodetectors, and processes them to create an image indicative of the radiation dispersion across the array of photodetectors. Because of their ability to produce images, imagers are useful in various applications, such as professional and consumer video, still image photography, remote surveillance, astronomy, and machine vision.

Conventionally, imagers have been used to detect radiation in the visible spectrum (i.e., radiation having a wavelength between 400-700 nanometers). Some conventional imagers, such as black and white imagers, merely detect the intensity of radiation in the visible spectrum, and provide little or no information about the specific wavelength of the detected radiation within the visible spectrum. However, conventional color imagers not only detect the intensity of radiation in the visible spectrum, but also provide information about the wavelength (indicative of color) of detected visible radiation.

Color imagers use different pixels within an imaging array to detect different colors within the visible spectrum, as shown in FIG. 1, which illustrates an exemplary arrangement of pixels 12 in an imaging array 10 of a conventional color imager. The imaging array 10 includes n rows and m columns of pixels. Each 2×2 pixel grouping has two green pixels 12G, one red pixel 12R, and one blue pixel 12B, commonly referred to as a Bayer pattern. Each pixel detects only radiation in a portion of the visible spectrum surrounding the designated color in the visible spectrum, and outputs a corresponding output signal. The raw output of the imaging array comprises a single color at each pixel. Before being displayed, each pixel typically is assigned a value for each of the three colors, red, green, and blue, e.g., by interpolation.

In conventional CMOS color imagers, each pixel includes a polymeric filter, usually on the top of the pixel. The wavelength of light detected by a given pixel is determined by its filter. For example, a green pixel, such as pixel 12G, has a filter made from a polymer that passes green light. Similarly, blue pixels have filters made from polymers that pass blue light, and red pixels have filters made from polymers that pass red light.

SUMMARY

According to an aspect of the invention, an apparatus comprising a plurality of pixels each configured to detect radiation incident thereon is provided. The plurality of pixels comprises a first pixel configured to detect a first range of wavelengths in the short wavelength infrared (SWIR) spectrum and produce a first photoresponse indicative of a quantity of radiation in the first range incident thereon, and a second pixel configured to detect a second range of wavelengths in the SWIR spectrum and produce a second photoresponse indicative of a quantity of radiation in the second range incident thereon, the second range differing from the first range. The apparatus further comprises readout circuitry configured to read out the first and second photoresponses.

According to another aspect, an apparatus is provided comprising a substrate, a plurality of pixels disposed on the substrate and configured to detect radiation incident thereon, and a metallization layer providing interconnections for at least two pixels of the plurality of pixels. The plurality of pixels comprises a first pixel comprising a photodetector disposed on the substrate, the photodetector comprising germanium, and a filter disposed between the photodetector and the metallization layer and configured to block a first range of wavelengths, comprising wavelengths greater than 700 nanometers, of the radiation incident thereon from reaching the photodetector and to pass a second range of wavelengths of the radiation incident thereon to the photodetector. The second range of wavelengths comprises radiation in the short wave infrared radiation spectrum.

According to another aspect, a semiconductor structure is provided comprising a substrate, a photodetector comprising at least one semiconductor material, the photodetector formed on or at least partially in the substrate, and a semiconductor layer configured as a filter to block at least some radiation having a wavelength greater than 700 nanometers incident on the semiconductor structure from reaching the photodetector and doped to be electrically conducting.

According to another aspect, a method is provided for use with an apparatus comprising a filter formed at least partially of a semiconductor material, the apparatus further comprising a plurality of electrical components comprising at least one photodetector. The method comprises acts of filtering, with the filter, at least some radiation having a wavelength greater than 700 nanometers from reaching the at least one photodetector, and conducting an electrical signal to and/or from at least one of the electrical components through a conduction path that comprises the semiconductor material of the filter.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
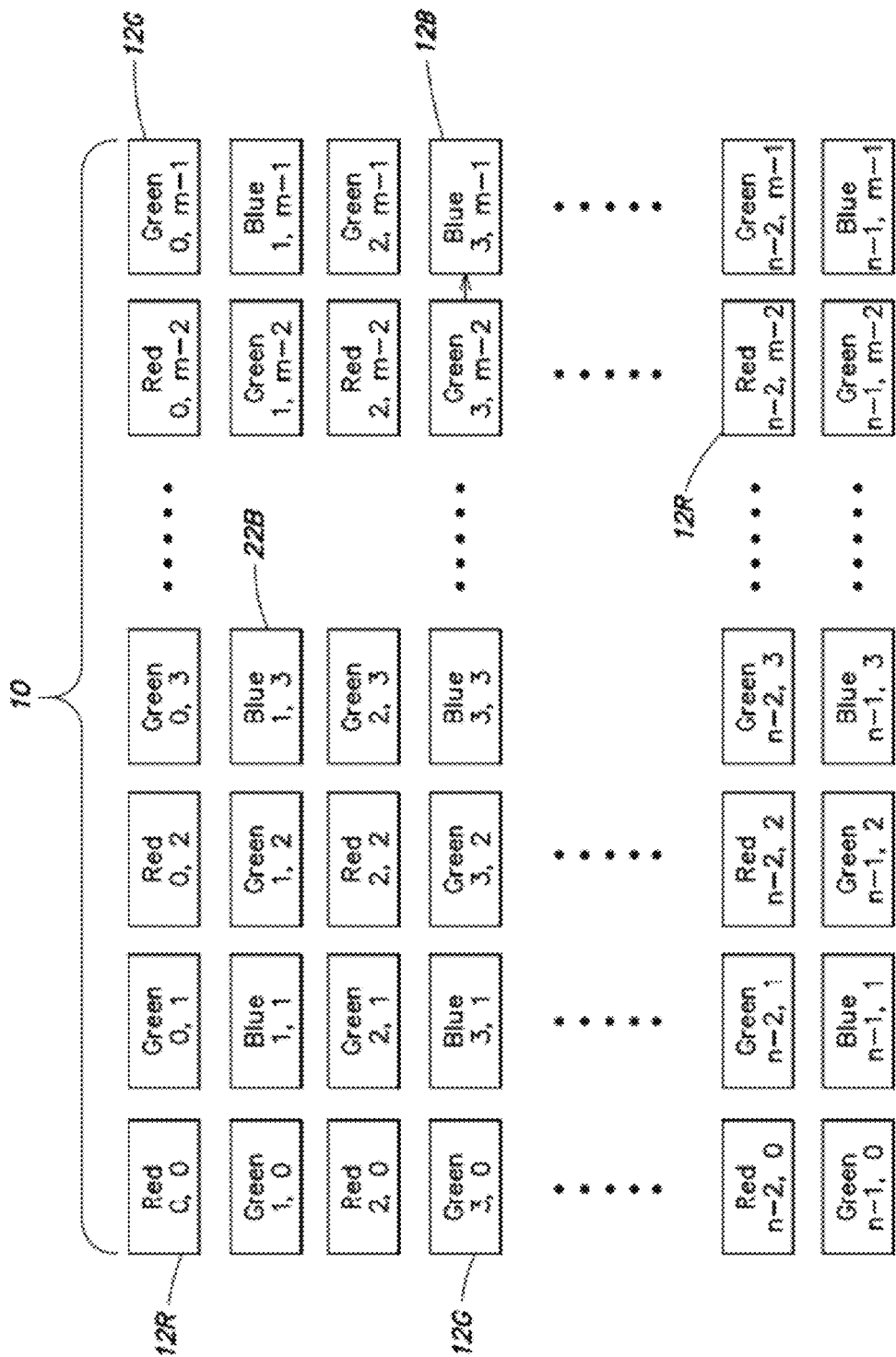
FIG. 1 illustrates an imaging array of color pixels arranged in a Bayer pattern, as known in the prior art.

As mentioned, some imagers are visible imagers, in that they detect incident radiation in the visible spectrum. Some visible imagers also detect radiation in the near infrared spectrum, ranging from 0.7 microns to 1.0 microns. Visible and near infrared imagers typically use silicon as the detection material. However, other materials, such as germanium, are capable of detecting longer wavelengths of radiation, for example up to 1.6 microns. The infrared (IR) spectrum ranges from approximately 0.7 microns to approximately 0.5 mm. Infrared imagers are those capable of detecting radiation in the infrared spectrum. An infrared imager may have a structure similar to that of a conventional imager. However, unlike the pixels of the conventional imager, at least some of the pixels of an infrared imager are capable of detecting IR radiation.

An infrared imager can be constructed in which all the pixels are capable of detecting the same range of wavelengths of IR radiation. In this setting, the resulting image would merely indicate the intensity of that range of wavelengths in the IR spectrum which all the pixels are capable of detecting, similar to a conventional black and white image. The image would not differentiate between, or provide any information about, multiple subsets of wavelengths within the IR spectrum.

Applicants have appreciated that it may be desirable for an IR imager to provide information regarding different wavelengths within the IR spectrum, or even within a subset of the IR spectrum, such as the short wavelength infrared (SWIR) spectrum, which ranges from approximately 1 micron to 2 microns. Such information could be desirable for any number of reasons. For example, some materials may reflect differently at different wavelengths within the SWIR spectrum. One example is skin, which tends to be highly reflective of radiation having a wavelength less than 1.4 microns, but is significantly less reflective of radiation having a wavelength greater than 1.4 microns. Therefore, having an imager capable of differentiating between different subsets of wavelengths within the SWIR spectrum (e.g., above or below 1.4 microns) could be advantageous for identifying materials (e.g., skin) in a scene, or in a variety of other applications.

One proposed scheme to construct a CMOS IR imager capable of producing an image that differentiates between two ranges of wavelengths in the SWIR spectrum is to use a bulk filter capable of blocking some radiation within the SWIR spectrum in combination with an imaging array having pixels that all detect the same range of wavelengths in the SWIR spectrum. To create an image that differentiates multiple ranges of wavelengths, multiple frames are taken and combined to form the image. Specifically, a first frame is taken using the imager in the absence of the bulk filter. Then, a second frame is taken with the bulk filter covering the imaging array, i.e., covering all the pixels of the imaging array, covering a lens assembly of the imager, or inserted between lenses of the lens assembly. The first and second frames can be combined to create a final image that provides information about the different ranges of wavelengths of radiation detected by the imager pixels.

The use of bulk filters has several drawbacks. For example, the need to position the bulk filter in front of the imager pixels for some frames, but not for others, requires moving the imager, the filter, or both. Thus, the imaging system may require moving parts, potentially adding to the complexity and cost of the system, and possibly limiting the system's usefulness. Also, the final image produced in the manner described above may not accurately represent a scene at a single point in time, given that it is a composite of at least two frames taken at separate times. Furthermore, the system can not be easily scaled to provide images differentiating between three or more ranges of wavelengths in the IR spectrum, since additional bulk filters and additional frames would be required to create the final image.

In view of the foregoing, Applicants recognize that is desirable to construct a monolithic IR imager that avoids the use of bulk filters by using different pixels of the imaging array to detect different ranges of wavelengths within the SWIR spectrum.

According to one aspect of the invention, an imager is provided in which different pixels of the imaging array detect different ranges of wavelengths in the SWIR spectrum. Thus, an image produced by the imager may differentiate between wavelengths within the SWIR spectrum, and furthermore may do so for a single frame, i.e., a single point in time. According to one embodiment, the imager may comprise two different types of pixels, with each type of pixel capable of detecting a different range of wavelengths in the SWIR spectrum. However, the various aspects of the invention are not limited in this respect, as the imager may comprise three or more different types of pixels, with each type of pixel detecting a different range of wavelengths in the SWIR spectrum. In this sense, the imager design may be scaled to detect any number of different wavelengths within the SWIR spectrum. Furthermore, the imager may include pixels capable of detecting different wavelengths in the visible and near IR spectra.

According to another aspect of the invention, an imager pixel comprising a SWIR filter is provided. The SWIR filter, in combination with a photodetector of the pixel, may dictate which wavelengths within the SWIR spectrum the pixel can detect. In some embodiments, the SWIR filter comprises a semiconductor material. The pixel may be a CMOS pixel, and the SWIR filter may be monolithically integrated as part of the CMOS pixel, thus avoiding any need for bulk filters, and simplifying the imager design and fabrication. When the SWIR filter comprises a semiconductor material, such as germanium, or a silicon-germanium alloy, conventional CMOS processing techniques and equipment may be used to form the filter. However, some aspects are not limited in this respect and can employ any suitable SWIR filter integrated with a pixel.

According to another aspect of the invention, a dual function semiconductor layer may be monolithically integrated with an imager pixel. The semiconductor layer may act as both a filter for SWIR radiation and as a conductor. The semiconductor layer may be appropriately doped, in both type and amount, to provide good electrical conductivity, enabling it to act as a wire, interconnect, gate, field plate, or other conducting structure within the pixel. The dual use of the semiconductor layer may reduce the need for additional wiring within the pixel, thereby simplifying the design and fabrication of the pixel, and improving imaging characteristics of the pixel, such as detection, noise, and fill factor.

Various aspects of the invention are now described in turn. These aspects can be used singly, all together, or in any combination of two or more.

SWIR Filter

Figure 2:
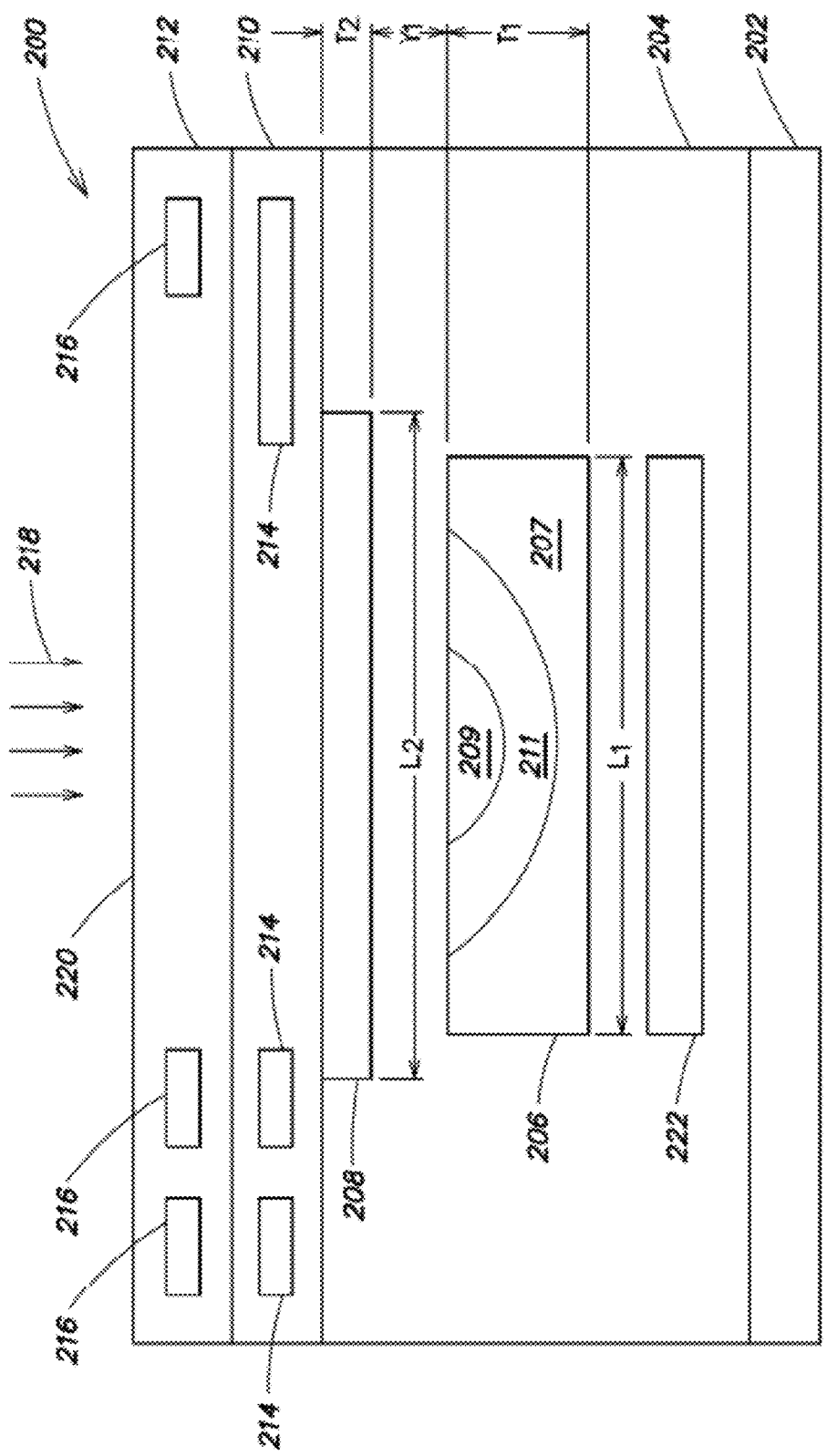
FIG. 2 is a cross-sectional view of a pixel structure having an integrated short wavelength infrared (SWIR) filter, according to one embodiment.

FIG. 2 illustrates one non-limiting embodiment of an imager pixel for detecting a subset of wavelengths in the SWIR spectrum. The pixel 200 comprises a substrate 202, which may be a silicon substrate. However, the various aspects of the invention are not limited in this respect, as any appropriate substrate material can be used. A dielectric layer 204 is formed on the silicon substrate 202. Photodetector 206 comprising an anode 207 and a cathode 209 is disposed in the dielectric layer 204, and may be formed by any appropriate method, as described further below.

The photodetector 206 may be formed of any material, or combination of materials, capable of detecting SWIR and/or visible and near IR radiation. For example, the photodetector 206 may comprise germanium, either as substantially pure germanium or as part of an alloy or superlattice structure. For example, the photodetector 206 may be a silicon-germanium alloy in a proportion given by $Si_{(1-x)}Ge_x$, where $0 \leq x \leq 1$. In one embodiment, the photodetector 206 comprises a majority of germanium, i.e., $x>0.5$. In an alternative embodiment, $x>0.8$. However, the photodetector 206 is not limited to being formed of any particular material, and it should be appreciated that the material chosen may depend on the specific wavelengths that are to be detected.

The anode and cathode may be formed by any suitable method. For example, the photodetector may be a lightly p-doped (i.e., $p^-$) material, the anode 207 may be formed by a boron implant of any suitable concentration, and the cathode 209 may be formed by a phosphorous implant of any suitable concentration. In the non-limiting example of FIG. 2, the anode may be highly doped $p^+$ and the cathode may be highly doped $n^+$, leaving a lightly doped $p^-$ region 211 in the photodetector 206. However, the photodetector is not limited to any particular types of implants to form the anode and cathode. Moreover, the positioning of the anode and cathode are not limiting, as they may be take any suitable positioning in the photodetector. The anode and cathode may be connected to contacts (not shown), such as vias, metal lines, etc. to read out the photoresponse of the photodetector 206.

When a silicon-germanium alloy is used for a photodetector, the maximum wavelength detectable by the photodetector (i.e., the cutoff wavelength) increases as the percentage of germanium increases. For example, if substantially pure germanium is used, the photodetector 206 may be capable of detecting radiation having a wavelength in the range from approximately 400 nanometers to approximately 1.6 microns. By contrast, if pure silicon is used (i.e., no germanium), the photodetector 206 may only be capable of detecting radiation having a wavelength in the range from approximately 400 nanometers to approximately 1.0 microns. By selecting the relative percentages of silicon and germanium in the silicon-germanium alloy, the maximum detectable wavelength of the photodetector 206 may be set at any desired wavelength between approximately 1.0 and 1.6 microns.

Figure 12:
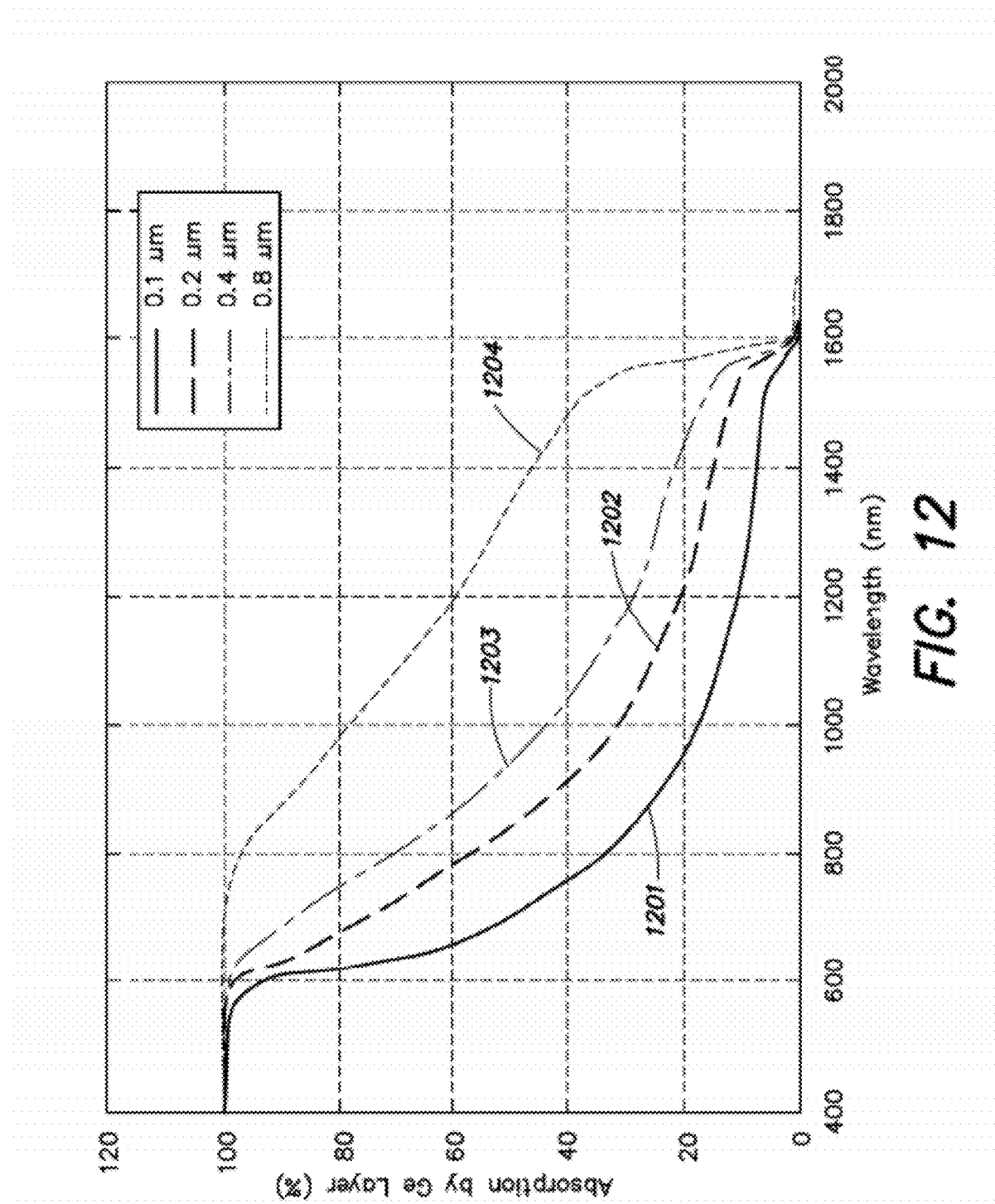
FIG. 12 illustrates absorption spectra for pure germanium having various thicknesses.

Other design characteristics of the photodetector 206 may be controlled to provide desired operating characteristics, without limiting the various aspects of the invention. For example, to improve detection efficiency, the photodetector 206 may comprise a highly crystalline material, such as monocrystalline germanium or a monocrystalline silicon-germanium alloy, comprising less than approximately $10^4$ defects per cubic centimeter (i.e., a defect density less than approximately $10^4$ cm$^{-3}$). However, the photodetector is not limited to any particular degree of crystallinity. Similarly, the photodetector 206 can have any thickness $T_1$, as the various aspects of the invention are not limited in this respect. In one embodiment, the thickness $T_1$ of the photodetector 206 may be chosen to ensure absorption of a substantial percentage of incident radiation in the SWIR spectrum. As an example, FIG. 12 illustrates absorption spectra for substantially pure germanium layers of differing thicknesses. The x-axis illustrates the wavelength of light absorbed and the y-axis illustrates the percentage of radiation of that wavelength which is absorbed. Line 1201 shows that a pure germanium layer having a thickness of approximately 0.1 microns absorbs substantially all incident radiation having a wavelength below 600 nanometers. Approximately 50% of incident radiation having a wavelength of 700 nanometers may be absorbed by a pure germanium layer having a thickness of approximately 0.1 microns. Line 1202 illustrates the absorption characteristics of a substantially pure germanium layer having a thickness of approximately 0.2 microns. Line 1203 illustrates the absorption characteristics of a substantially pure germanium layer having a thickness of approximately 0.4 microns. Line 1204 illustrates the absorption characteristics of a substantially pure germanium layer having a thickness of approximately 0.8 microns.

Accordingly, it will be appreciated that the thickness of the photodetectors described herein may be chosen to provide a desired percentage absorption for a desired range of wavelengths depending on the nature of the material used for the photodetector. It will be appreciated that while FIG. 12 illustrates the absorption characteristics for pure germanium, the photodetectors and the SWIR filters described herein are not limited to pure germanium, but may be formed from any suitable material. Absorption spectra for other types of materials (other than pure germanium), similar to those illustrated in FIG. 12, may be used to facilitate selection of the thicknesses of photodetectors and filters formed of those other types of materials.

In the embodiment shown in FIG. 2, the pixel 200 further comprises a filter 208 disposed in dielectric layer 204, above the photodetector 206, to filter radiation 218 incident upon the pixel. Thus, in this non-limiting embodiment, the filter 208 may be monolithically integrated with the photodetector 206. As shown, the filter 208 has a surface substantially co-planar with a backend dielectric layer 210, described further below. However, the filter 208 can be oriented or positioned in other ways, while still being positioned between the imaging side of the pixel (i.e., the side where incident radiation arrives) and the photodetector 206. For example, the filter 208 may be disposed in, and covered by, the dielectric layer 204, may be angled relative to the surface of the backend dielectric layer 210, or positioned in other ways.

The filter 208 may be positioned and dimensioned in any suitable manner. For example, the filter 208 may have any length $L_2$, and may advantageously have a length $L_2$ equal to, or greater than, a length $L_1$ of the photodetector 206. However, the aspect of the invention directed to a pixel comprising a SWIR filter and a photodetector is not limited to any particular size of the SWIR filter. Similarly, the proximity of filter 208 to photodetector 206 is not limiting, as the two pixel components may be separated by any distance $Y_1$. In one embodiment, the distance $Y_1$ may be chosen to be small, to improve the efficiency of the filter by increasing the likelihood that radiation 218 incident upon the pixel 200 must pass through, and not around, the filter 208 to reach the photodetector 206. The filter 208 may be positioned approximately symmetrically above the photodetector 206 in the dimension of the lengths $L_1$ and $L_2$, as shown, or may be positioned in any other suitable manner. In one embodiment, the relative positioning of the photodetector 206 and filter 208 may be chosen to ensure that radiation 218 incident on the pixel 200 must pass through the filter 208 to reach the photodetector 206.

The filter 208 may be made of any suitable material. In accordance with one embodiment, the filter 208 may comprise a semiconductor material. For example, the filter 208 may comprise a silicon-germanium alloy capable of absorbing at least some radiation in the SWIR spectrum. The filter 208 may therefore operate as a SWIR filter by blocking some wavelengths of radiation in the SWIR spectrum from reaching the photodetector 206, while allowing other wavelengths of radiation in the SWIR spectrum to reach the photodetector 206. The semiconductor material in filter 208 may have any crystal structure, (e.g., monocrystalline, polycrystalline, or amorphous), as the aspects of the invention relating to a pixel comprising a SWIR filter are not limited in this respect. The operation of the filter 208 is described in further detail below.

It should also be appreciated that the filter 208 may be used to block wavelengths in some spectra, while passing all incident radiation in the SWIR spectrum. For example, the filter 208 may be formed of a suitable material, and having suitable dimensions (e.g., thickness), to absorb, or otherwise block, incident radiation in the visible and near IR spectra, while passing incident radiation in the SWIR spectrum. One implementation might use a filter 208 formed of substantially pure silicon. The silicon may be capable of absorbing wavelengths in the visible spectrum and some or all of the near IR spectrum, but may pass all wavelengths in the SWIR spectrum. Thus, the filter 208 may also be considered to be a SWIR pass filter.

The filter 208 may have any suitable thickness $T_2$. For example, the thickness of the filter 208 may be selected based on the type of material used to form the filter, and may be selected to provide a desired percentage of absorption of a desired range of wavelengths. For example, as previously discussed in connection with photodetector 206, the thickness of filter 208 may be selected by referring to FIG. 12, or any other suitable absorption spectra data.

The pixel 200 may further comprise backend layers, comprising backend dielectric layers 210 and 212. The backend dielectric layers 210 and 212 may comprise any suitable material, as the various aspects of the invention are not limited in this respect, and may serve any function, as the various aspects of the invention are also not limited in this respect. For example, the backend dielectric layers may passivate the underlying layers, or may be used to support metalization layers 214 and 216, which may be formed in the dielectric layers 210 and 212, respectively. The metalization layers 214 and 216 may be used to connect the photodetector 206 to surrounding pixel circuitry, or to interconnect components in different pixels. As discussed in further detail below, in some embodiments, when fabricating the pixel 200, filter 208 may be formed after formation of the photodetector 206 and prior to formation of the backend layers 210 and 212 and the metalization layers 214 and 216. Other arrangements are also possible in which metal is not disposed between the imaging side of the pixel and the photodetector.

In operation, radiation 218 may be incident upon surface 220 of the pixel 200. It will be appreciated that the radiation 218 may be incident across the entire surface area or surface 220 of the pixel 200 (and furthermore may be incident upon an entire imaging array comprising the pixel 200), or only portions thereof. The radiation 218 may comprise various wavelengths, although the aspects of the invention relating to a pixel comprising a SWIR filter are not limited to use in any particular application/environment. In some applications, the incident radiation may include wavelengths in both the visible spectrum and the infrared spectrum. For example, the radiation 218 may comprise wavelengths ranging from approximately 400 nanometers to approximately 1.6 microns, thereby spanning the visible, near IR, and SWIR spectra. However, this is just an example, as the pixel 200 can by used in other environments with radiation in different wavelengths.

The radiation 218 may pass through backend dielectric layers 210 and 212, and reach filter 208. Upon receiving the radiation 218, the filter 208 may function as an absorption filter, i.e., absorbing some of the radiation, while passing some of the radiation to the photodetector 206. For example, again referring to FIG. 12, the filter 208 may be formed from substantially pure germanium, having the absorption characteristics illustrated in FIG. 12. For example, if the thickness $T_2$ of the filter 208 is approximately 200 nanometers (nm), the filter may absorb more than approximately 50% of incident radiation having a wavelength of less than approximately 900 nanometers, while absorbing less than approximately 50% of incident radiation having a wavelength greater than approximately 900 nanometers (i.e., passing a majority of incident radiation having a wavelength greater than 900 nanometers). The concept is illustrated in FIGS. 3A and 3B.

Figure 3A:
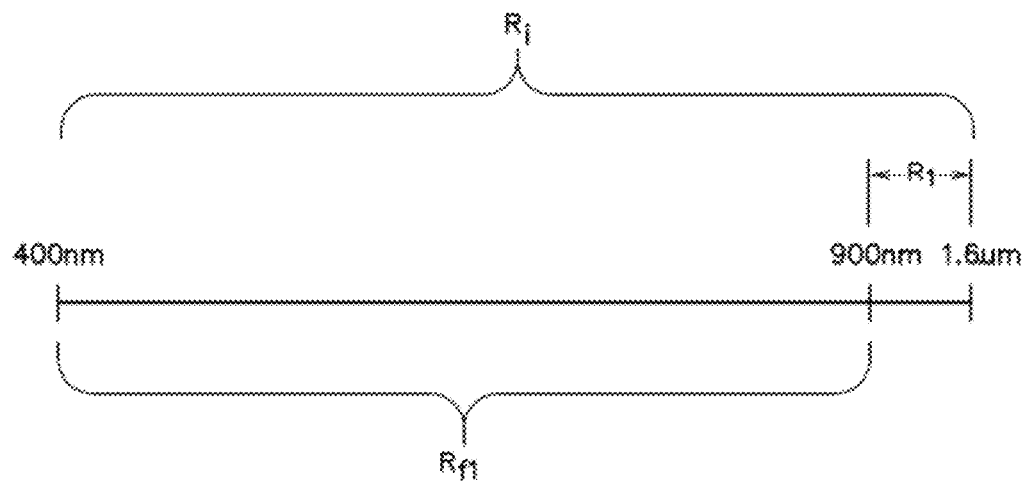
FIGS. 3A and 3B illustrate radiation spectra relating to the operation of a SWIR filter like that illustrated in the pixel of FIG. 2, according to one embodiment.

As shown in FIG. 3A, the incident radiation 218 may include a range $R_i$ of wavelengths from approximately 400 nanometers to approximately 1.6 microns, although the various aspects of the invention are not limited in this respect, and this is merely an example of a range of wavelengths in the incident radiation. For purposes of this non-limiting example, photodetector 206 may be formed of substantially pure germanium and may therefore be capable of detecting the entire range $R_i$ of wavelengths when having a suitable thickness, and the filter 208 may be a silicon-germanium alloy having an upper cutoff wavelength of approximately 900 nanometers. For example, the filter 208 may be formed of a silicon-germanium alloy having a sufficient thickness to absorb a majority of the incident radiation in the range $R_{f1}$ from approximately 400 nanometers to approximately 900 nanometers. As a result, in the non-limiting example of FIG. 3A, the only wavelengths of incident radiation which reach the photodetector 206 are those in range $R_1$, comprising wavelengths from approximately 900 nanometers to approximately 1.6 microns.

Figure 3B:
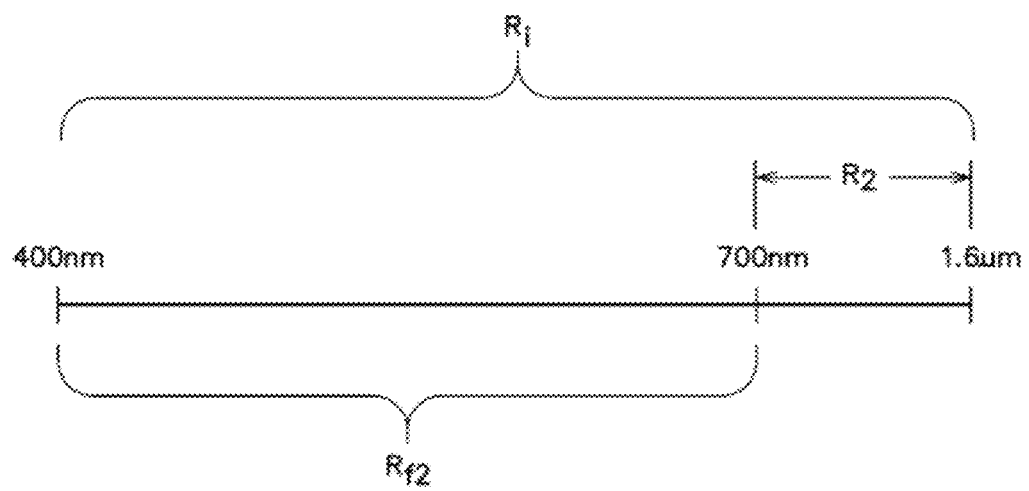

FIG. 3B illustrates the operation of a different filter 208 having a different composition than that producing the results shown in FIG. 3A. As shown in FIG. 3B, the incident radiation 218 may include the range $R_i$ of wavelengths from approximately 400 nanometers to approximately 1.6 microns. Again, for purposes of another non-limiting example, photodetector 206 may be capable of detecting the entire range $R_i$ of wavelengths. The filter 208 may be a silicon-germanium alloy having an upper cutoff wavelength of approximately 700 nanometers. For example, the filter 208 in this example may comprise a lower percentage of germanium than the filter 208 producing the results in FIG. 3A. In the example of FIG. 3B, the filter 208 may absorb substantially all of the incident radiation in the range $R_{f2}$ from approximately 400 nanometers to approximately 700 nanometers. As a result, the only wavelengths of incident radiation which reach the photodetector 206 are those in range $R_2$, comprising wavelengths from approximately 700 nanometers to approximately 1.6 microns. In the examples of FIGS. 3A and 3B, it should be appreciated that the range $R_1$ is a subset of the range $R_2$.

As the examples of FIGS. 3A and 3B demonstrate, pixels of the type illustrated in FIG. 2 can be designed to detect different gradations within the SWIR spectrum, analogous to color detection within the visible spectrum. The ranges of wavelengths detected by a pixel 200 (i.e., ranges $R_1$ and $R_2$) may be determined by appropriate choice of the photodetector 206 and the filter 208. The photodetector material may determine the maximum detectable wavelength of the photodetector, e.g., 1.6 microns in FIGS. 3A and 3B, while the filter 208 may determine the lower wavelength limit of radiation that reaches, and therefore is detectable by, the photodetector 206 by absorbing wavelengths below this lower wavelength limit. In some embodiments, the upper and lower wavelengths of radiation detected by a pixel 200 may each be selected to have a value anywhere in the range from approximately 400 nanometers to approximately 1.6 microns. For example, the upper and lower wavelengths of radiation detected by a pixel 200 may be at least partially determined by suitable selection of the materials used to form the photodetector and the filter, as well as the thicknesses of the structures. Again, reference is made to FIG. 12 as one non-limiting example of how the type of material and thickness of the material may be selected to provide the desired absorption functionality.

The pixel 200 may further optionally comprise a layer 222, as shown in FIG. 2, which may be a metal silicide layer. The layer 222 may be disposed in the dielectric 204, and may reflect radiation not initially detected by photodetector 206 back towards photodetector 206, thereby improving the detection efficiency of the photodetector, and also shielding underlying circuitry (such as transistors in the substrate 202) from the radiation. Furthermore, the layer 222 may prevent stray light from an adjacent pixel reflecting off the substrate 202 and into photodetector 206, which would result in erroneous detection of the radiation 218 at the point of pixel 200. As an example, stray light from one pixel may reflect off the substrate of the pixel 200 in FIG. 2 and proceed toward photodetector 206. However, the layer 222 may block that radiation from entering photodetector 206, thereby preventing the detection of light not associated with that pixel.

An example of layer 222 can be found in U.S. patent application Ser. No. 11/351,638, titled "SEMICONDUCTOR PHOTONIC DEVICES WITH ENHANCED RESPONSIVITY AND REDUCED STRAY LIGHT," filed Feb. 10, 2006, and hereby incorporated by reference in its entirety. As described in that application, the layer 222 may comprise a reflective material, such as a metal silicide or other suitable material. It will be appreciated that the layer 222 is merely optional, and may be excluded entirely, as the various aspects of the invention are not limited in this respect.

Figure 4:
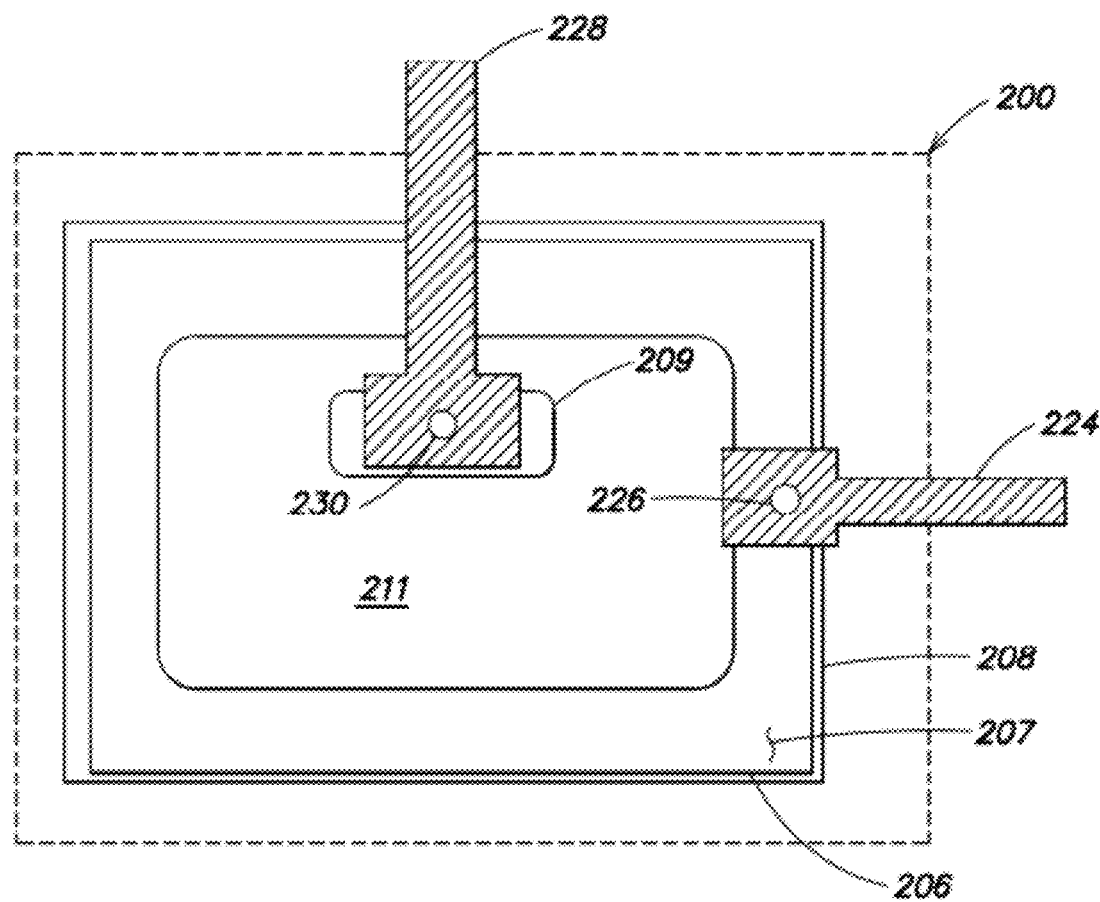
FIG. 4 illustrates a top-down view of the pixel of FIG. 2.

FIG. 4 illustrates one example of a top-down view of pixel 200 from FIG. 2 (i.e., a view looking toward pixel 200 from surface 220). In FIG. 4, the boundaries of pixel 200 are indicated by dashed lines. Not all structures of the pixel 200 are illustrated in this view.

As shown, the filter 208 covers substantially all of the photodetector 206. As mentioned, the photodetector 206 may be lightly doped p-type, and may comprise an anode 207, which may be highly doped p-type. The photodetector 206 also comprises a cathode 209, which may be highly doped n-type. The lightly doped p-type region 211 is between the anode and the cathode. As shown, contacts to the cathode and anode are provided for the pixel 200. Holes may be formed in the filter 208 to provide for the contacts. A first metallization line 224 may be formed and may contact a via 226 (formed in a hole in the filter 208) to provide contact to the anode 207. Similarly, a second metallization line 228 may be formed to contact the via 230 (formed in a hole in the filter 208), which may provide contact to the cathode 209. These structures may be formed of any suitable materials, as the pixel 200 is not limited to any particular materials. For example, the metallization lines 224 and 228 may be formed from aluminum or any other suitable material. Similarly, the vias 226 and 230 may be formed from tungsten or any other suitable material for providing contact to the anode and cathode regions.

Figure 15:
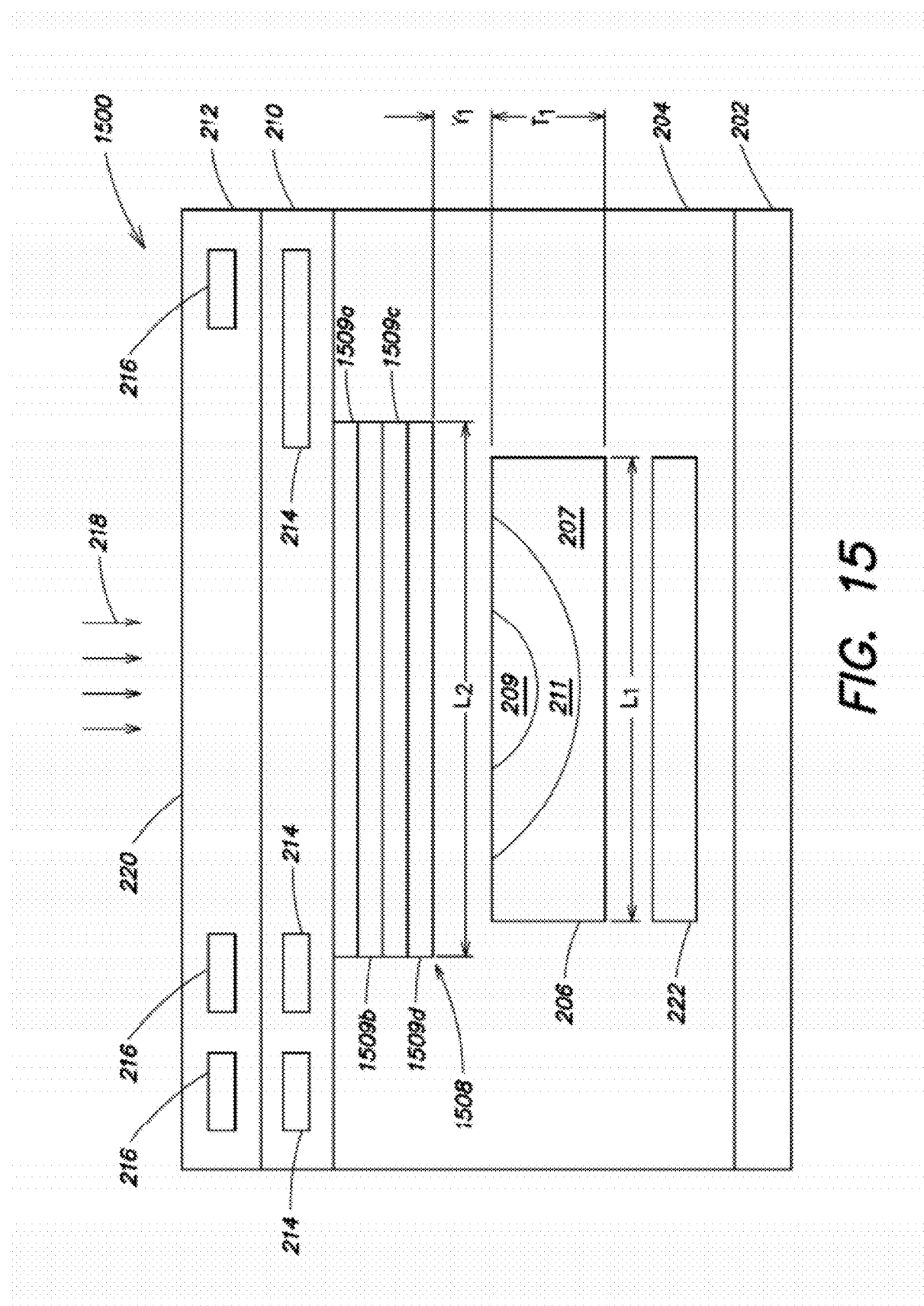
FIG. 15 illustrates a pixel having a SWIR interference filter, according to one embodiment.

As has been described in connection with FIG. 2, the filter 208 may operate as an absorption filter to block some wavelengths of incident radiation from reaching the photodetector 206. However, other types of filters, such as interference filters can be used to filter radiation in the visible, near IR, and/or SWIR spectra. FIG. 15 illustrates an example.

FIG. 15 illustrates a pixel 1500 in which the SWIR filter is an interference filter. As shown in the non-limiting example of FIG. 15, the filter 1508 comprises four layers 1509a-1509d. The layers may be formed of any suitable materials (e.g., dielectric materials), and may each have any suitable thickness to provide desired filtering functionality. For example, each of the layers 1509a-1509d may be selected from silicon dioxide (having a refractive index of approximately 1.46), silicon nitride (having a refractive index of approximately 2), and polysilicon (having a refractive index of approximately 4). It should be appreciated that the layers 1509a-1509d do not have to be formed of the same material as each other. By forming the layers 1509a-1509d from suitable materials, such as those listed above, each of the layers 1509a-1509d may be transparent to incident radiation in the SWIR spectrum. Yet, by suitable selection of the thickness of each of the layers 1509a-1509d, the filter 1508 may filter incident radiation, for example in the SWIR spectrum, as an interference filter.

By suitable selection of the thicknesses of layers 1509a-1509d, the interference filter 1508 may be made to operate as one of several types of filters. For example, the filter 1508 may operate as a high pass filter, a low pass filter, a band pass filter, or a band reject filter.

It should be appreciated that the positioning of filter 1508 shown in FIG. 15 is non-limiting. As shown, according to one implementation, the filter 1508 may be disposed in the dielectric 204, in close proximity to the photodetector 206. Alternatively, the filter 1508 may be formed on the upper surface 220 of the pixel 1500. Other configurations are also possible, such as forming the filter 1508 in one of the backend dielectric layers 210 or 212.

Method of Forming SWIR Filter

Figure 5A:
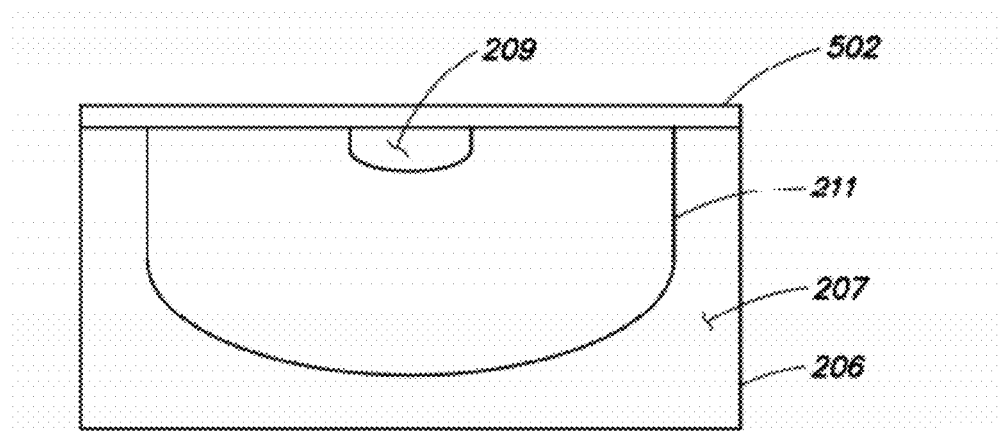
FIGS. 5A-5G show process steps for fabricating the pixel structure of FIG. 2.
Figure 5B:
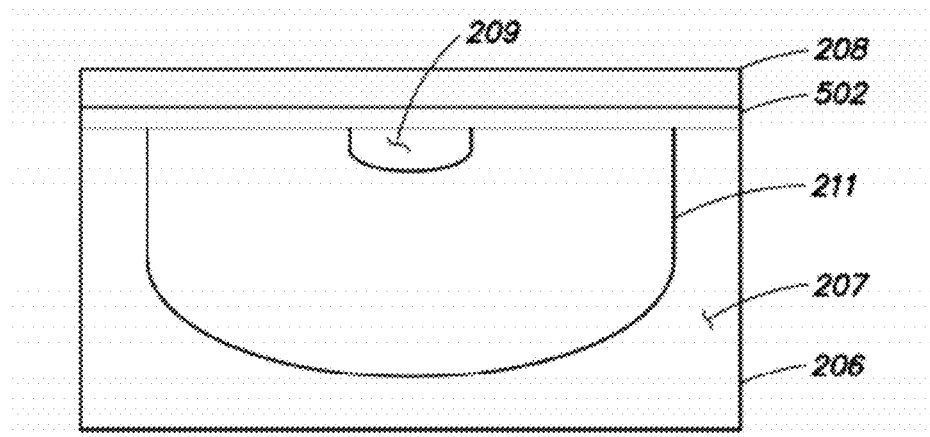
Figure 5C:
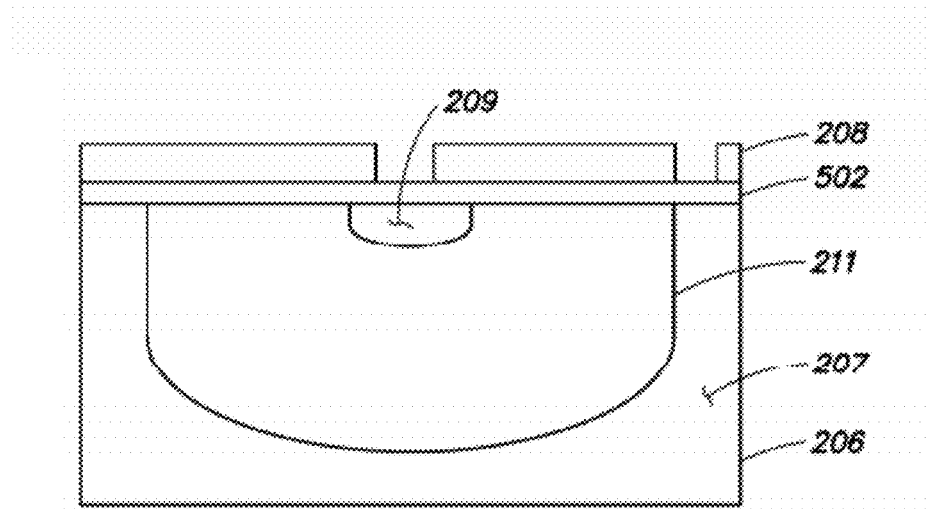

FIGS. 5A-5G illustrate one non-limiting process sequence for forming a pixel having a photodetector and an integrated SWIR filter, such as pixel 200 illustrated in FIG. 2. The process sequence focuses on the formation of the photodiode and the filter, so that for simplicity some structures of pixel 200 (e.g., the substrate, the backend layers, the layer 222, etc.) are omitted. FIG. 5A illustrates the photodetector 206, comprising an anode 207 and a cathode 209. The anode and cathode may be formed by any suitable method, such as implantation of suitable dopants. A passivation dielectric layer 502 may be formed on the photodetector 206 by any suitable method. The passivation dielectric layer 502 may correspond to the dielectric 204 in FIG. 2, however, the process is not limited in this respect. As shown in FIG. 5B, the filter 208 may be deposited on the passivation dielectric layer 502 by any suitable method. In FIG. 5C, the filter 208 is patterned to provide contact holes to the cathode and anode of photodetector 206. The patterning may be accomplished by any suitable method.

Figure 5D:
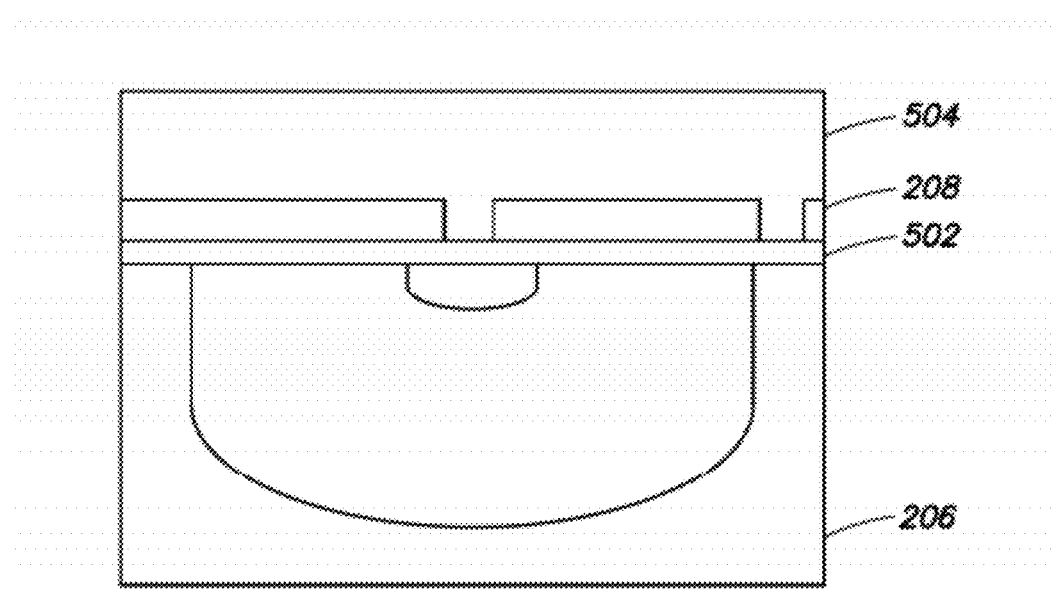

As shown in FIG. 5D, a dielectric 504 may be deposited by any suitable method to substantially cover the filter 208 and fill the holes formed in the filter 208 by the patterning process of FIG. 5C. The dielectric 504 may be any suitable type of material. The dielectric may further be planarized, for example by chemical-mechanical polishing (CMP).

Figure 5E:
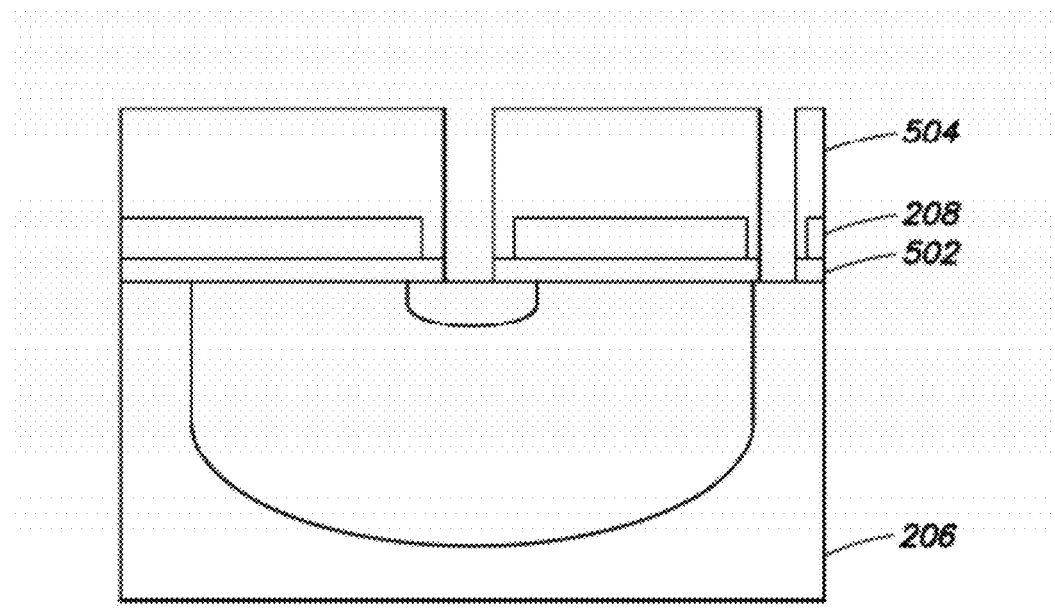
Figure 5F:
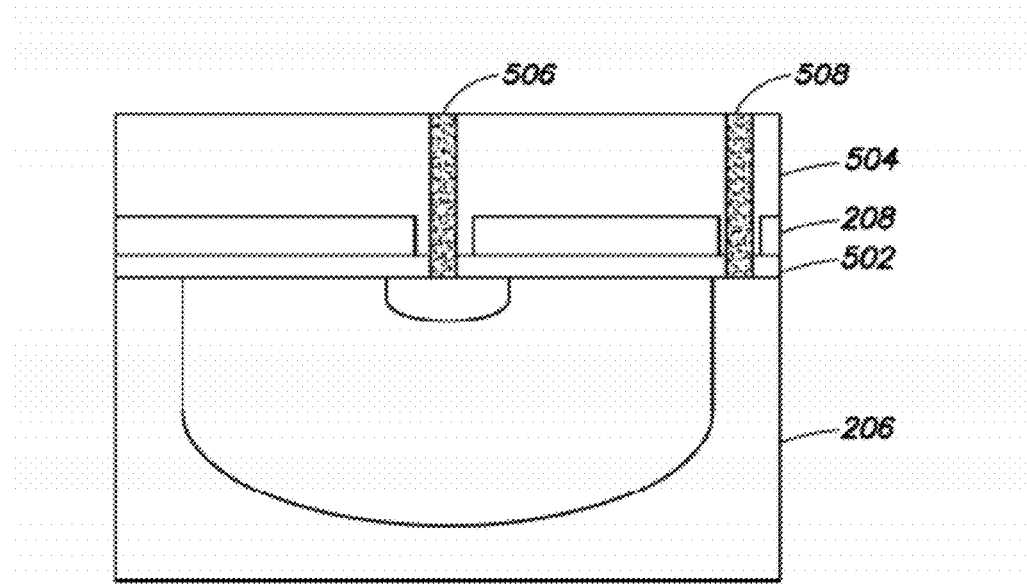

As shown in FIG. 5E, the dielectric 504 and the passivation dielectric layer 502 may be patterned to form contact holes for contacting the anode and cathode. The patterning may be accomplished by any suitable method. Then, in FIG. 5F the holes opened during the patterning of FIG. 5E may be filled with a contact material to form contacts 506 and 508 for contacting the cathode and anode. The contacts 506 and 508 may be formed of any suitable material, such as tungsten or any other suitable material. The contacts 506 and 508 may then be planarized.

Figure 5G:
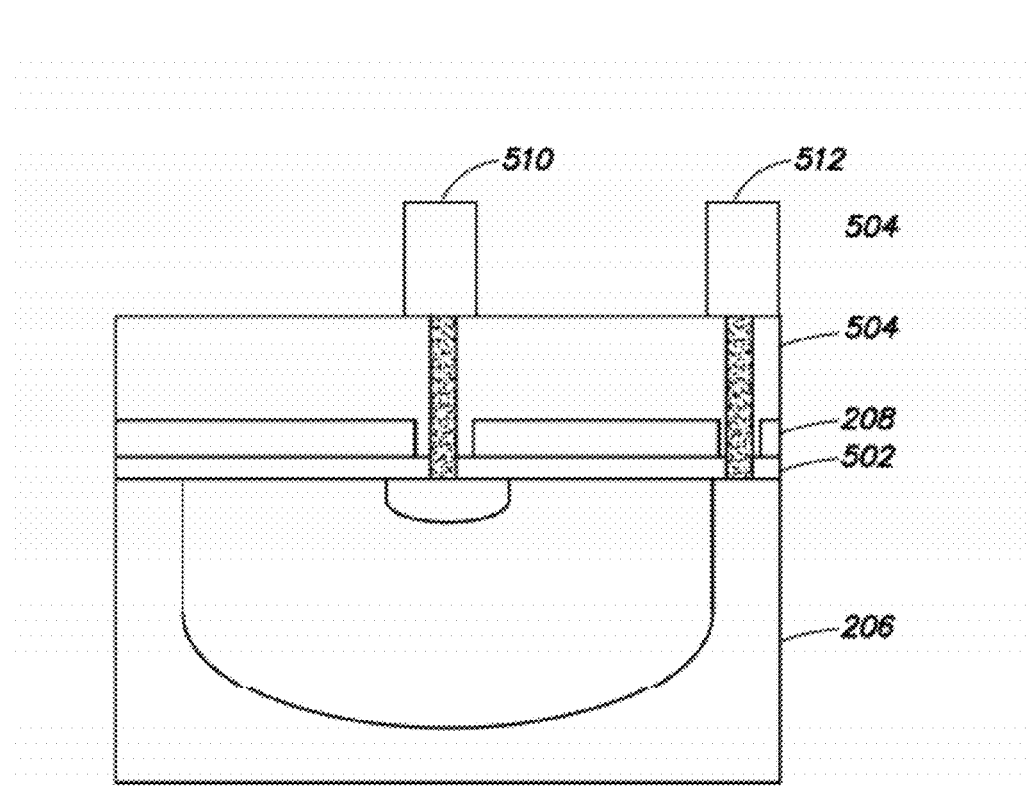

As shown in FIG. 5G, metallization lines 510 and 512 may then be formed to provide access to the contacts 506 and 508. The metallization lines 510 and 512 may be deposited and patterned, or formed by any other suitable method. In addition, metallization lines 510 and 512 may be formed of any suitable material, such as aluminum, or any other suitable metallization material.

It will be appreciated that the sequence of FIGS. 5A-5G is merely one non-limiting example, and that pixels of the type described herein may be formed by any suitable process.

Pixels Having Different Photodetectors for Detecting Different Wavelengths

As has been described, one manner in which to control the wavelengths of incident radiation detected by a pixel is by use of a filter in combination with a photodetector. A second manner in which to control the wavelengths detectable by a pixel is by appropriate design or modification of the photodetector of the pixel, regardless of whether a filter is used. For example, two different pixels of an imaging array may have different photodetector types or designs, so that the two different pixels may detect different wavelengths, or gradations, of incident radiation.

One design characteristic of a photodetector which can alter the wavelengths of radiation detectable by that photodetector is material. For example, as has been mentioned, germanium photodetectors may be capable of detecting different wavelengths of radiation than silicon photodetectors. Another characteristic of a photodetector which can impact the radiation detectable by that photodetector is the thickness of the photodetector, as previously mentioned in connection with FIG. 12.

Figure 13:
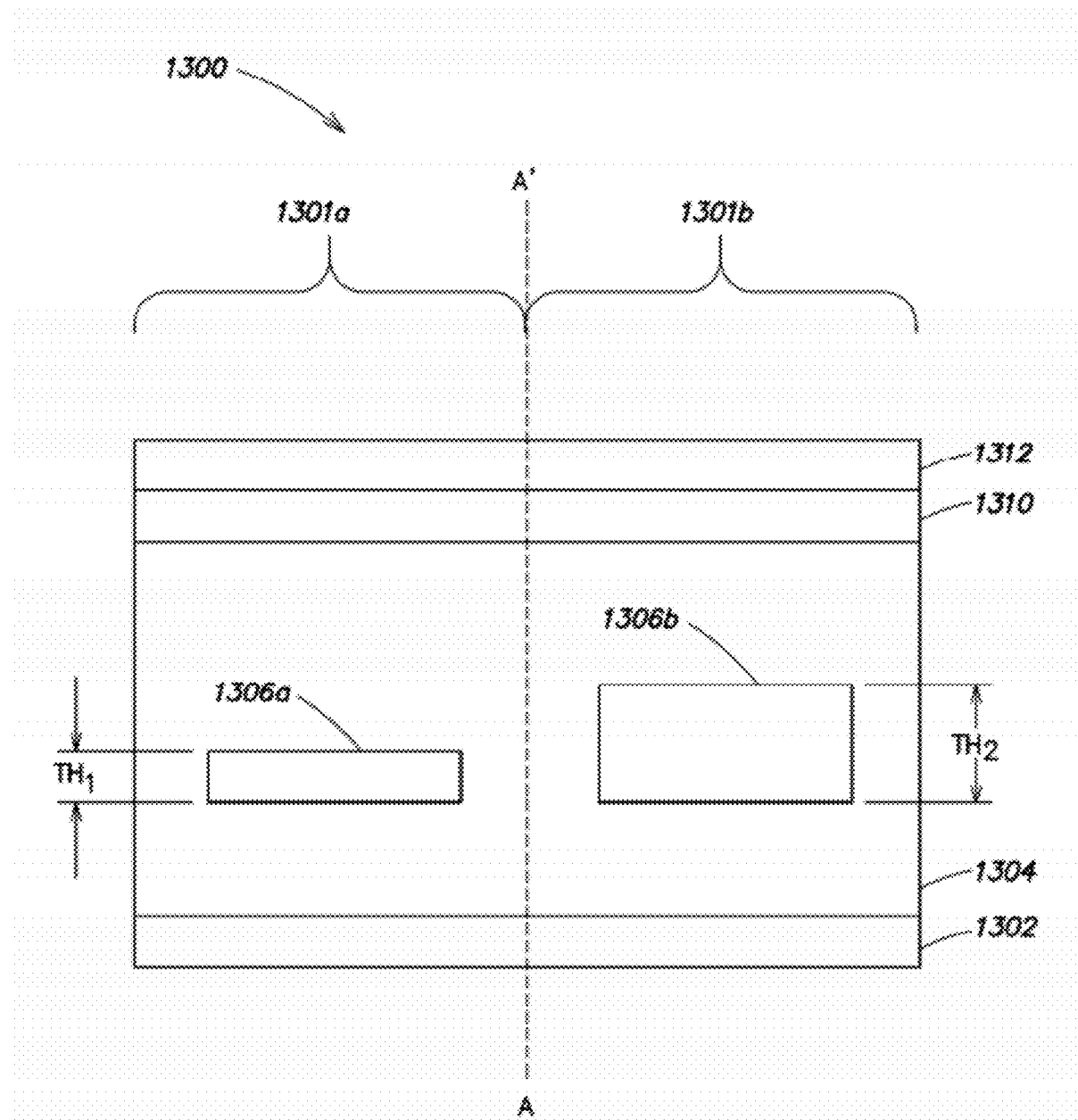
FIG. 13 illustrates two pixels having photodetectors of different thicknesses, according to one embodiment.

FIG. 13 illustrates one example of two pixels of an imaging array having photodetectors of different thicknesses which may provide differing detection capabilities. The structure 1300 comprises pixels 1301a and 1301b, which may be part of a larger imaging array. Line A-A' represents a conceptual boundary between pixels 1301a and 1301b, and it should be appreciated that no physical boundary need be present. The pixels may share a common substrate 1302, dielectric layer 1304, and common backend dielectric layers 1310 and 1312.

The pixels 1301a and 1301b each comprise a photodetector, shown as photodetectors 1306a and 1306b, respectively. The photodetectors may be made of the same material, but have differing thicknesses. For example, photodetector 1306a has a thickness $TH_1$, and photodetector 1306b has a thickness $TH_2$. The thicknesses $TH_1$ and $TH_2$ may be different. As described earlier in connection with FIG. 12, the thickness of the photodetector (and filters) can impact the wavelengths detectable by the photodetector. Thus, even if photodetectors 1306a and 1306b are made of the same material (e.g., a silicon-germanium alloy comprising 80% germanium), they may have different detection capabilities because of the differing thicknesses. Thus, by suitable selection of the thicknesses $TH_1$ and $TH_2$, for example by using data like that in FIG. 12, an array of pixels may be formed in which the different pixels, or different subsets of the pixels, detect different ranges of incident radiation because the photodetectors of the different pixels, or subsets of pixels, have different thicknesses.

It should be appreciated that the thicknesses $TH_1$ and $TH_2$ may be chosen in dependence on the desired detection capabilities for the photodetectors, and therefore may differ by any suitable amount. For example, in some embodiments the thickness $TH_2$ may be at least two times greater than the thickness $TH_1$. In some embodiments, the thickness $TH_2$ may be at least three times greater than the thickness $TH_1$. It should be appreciated that these are merely examples, and the aspect of the invention relating to pixels having photodetectors of different thicknesses is not limited to any particular difference between the thicknesses of the photodetectors.

The structure 1300 may be formed in any suitable manner. For example, a dielectric layer may be formed on the substrate 1302. Two trenches having approximately equivalent depths may be formed in the dielectric layer to accommodate formation of photodetectors 1306a and 1306b. The photodetector material (e.g., silicon-germanium) may then be formed in the trenches, for example by deposition or growth, to form the photodetectors. One of the photodetectors, such as photodetector 1306a, may then be etched by any suitable etching technique, to reduce its thickness. The second photodetector, 1306b in this example, is not etched. Thus, by etching one of the photodetectors, and not the other, or by etching them by different amounts, the thickness $TH_1$ and $TH_2$ may be made different, thus providing the photodetectors with different detection capabilities. The dielectric layer may then be completed to form dielectric layer 1304, and the backend dielectric layers 1310 and 1312 may be formed by any suitable method, such as deposition.

It should be appreciated that other methods of forming pixels having photodetectors of different thicknesses may also be possible, and no particular method is required by the aspect of the invention relating to different pixels having photodetectors of different thicknesses.

Imager Structure

Some aspects of the invention are directed to an imager which can detect, and produce an image differentiating between, multiple ranges of wavelengths in the SWIR spectrum. The imager may take any suitable form. For example, the imager may comprise a focal plane array in which different pixels detect different wavelength ranges in the SWIR spectrum. For example, the focal plane array may comprise two (or more) different types of pixels, with each type of pixel detecting a different range of wavelengths within the SWIR spectrum. In some embodiments, the different types of pixels may be monolithically integrated into the focal plane array. The different ranges detected by the different pixels may overlap (e.g., one range may be a subset of another range) or may be distinct. The aspects of the invention that relate to a SWIR imager are not limited to any particular number of types of pixels (e.g., three or more types of pixels may be used in the focal plane array), nor to any particular pixel arrangement, as pixels may be arranged in any desired configuration.

According to one aspect, an imager may comprise pixels capable of detecting, and differentiating between, SWIR radiation and visible and/or near IR radiation. For example, a first subset of pixels of the imager may detect SWIR radiation, while a second subset of pixels of the imager may detect visible radiation. Other configurations are also possible.

Figure 6:
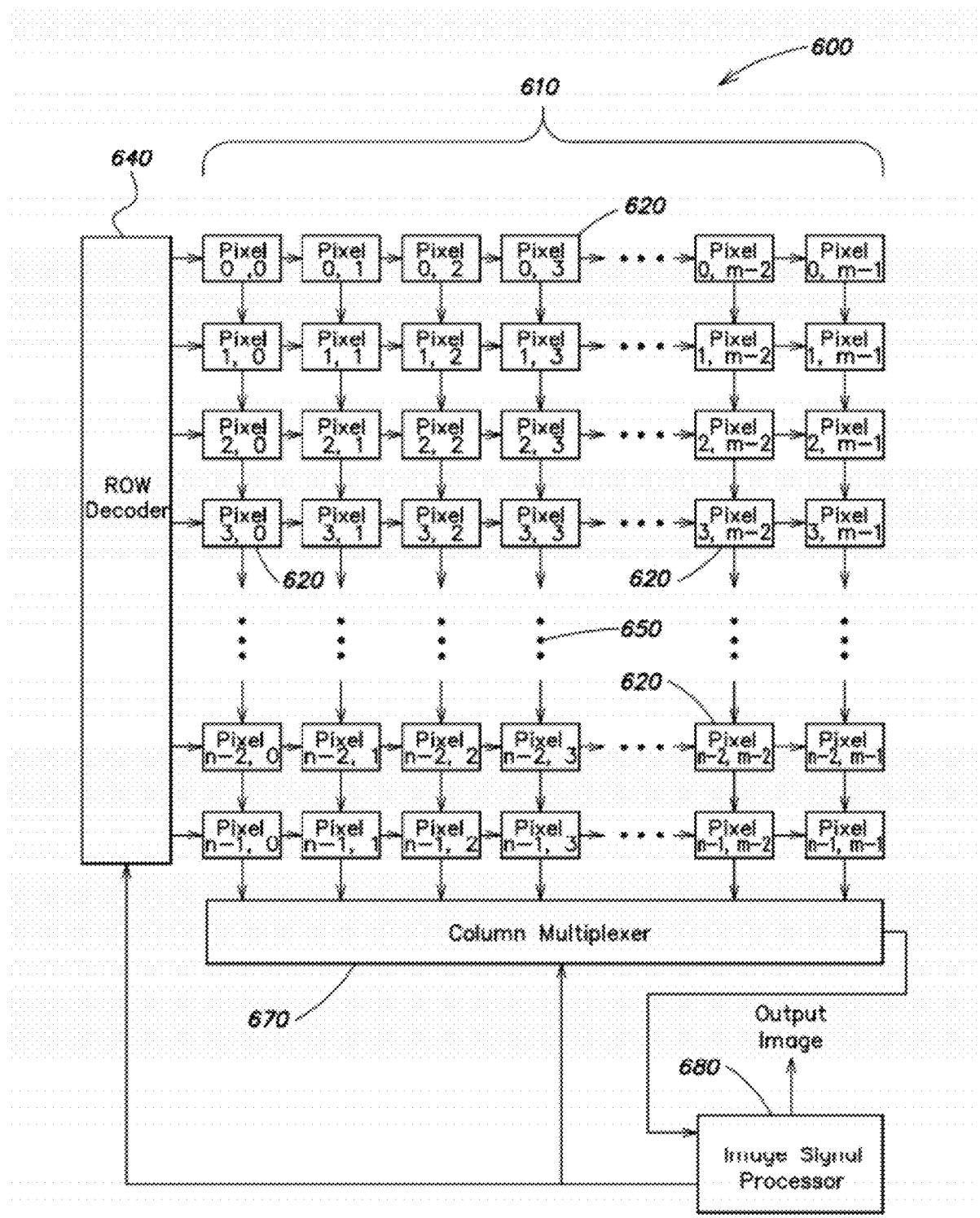
FIG. 6 illustrates an approximate physical configuration of an imager.

FIG. 6 illustrates a schematic block diagram and approximate physical layout of a CMOS imager 600. The imager 600 comprises an array 610 of pixels 620, arranged in an n-row by m-column configuration. The pixels 620 may each contain a photodetector and multiplexing circuitry, and may optionally include signal amplification and processing circuitry. Each pixel may generate an output signal proportional to the accumulated incident radiation detected by the photodetector, and these output signals are used by an image signal processor 680 to produce the resulting image.

The reading out and processing of the photodetector output signals may be accomplished via row and column multiplexers. For instance, the pixels 620 in a single row can be controlled by a set of row signals generated by a row decoder 640. The row decoder contains circuits that perform row address and timing functions within the pixel, such as controlling pixel reset and the length of time during which the pixel detects radiation, often referred to as the integration period. The pixels in a single row can be output onto a column bus 650 at the same time, while pixels in different rows can be output at different times. Staggering the outputs of rows of pixels in this manner allows the pixels in a column to share column bus 650, multiplexing their output signals sequentially onto the column bus one row at a time. All the pixels 620 in a single column send their output signals to a column multiplexer 670 via the column bus 650.

Processing of the pixel output signals may be performed by the column multiplexer 670 and the image signal processor 680 to produce the desired image. Additional circuitry (not shown) within the column multiplexer 670 can perform a number of functions, including amplification, noise reduction, and multiplexing into predefined video or image formats, e.g., a standard TV video sequence. The video or image signals generated by the column multiplexer 670 can be further processed by image signal processor 680 to reorganize, improve, and enhance the resulting image. For example, the image signal processor may detect and highlight edges in the image, or may adjust the average image intensity using control signals to modify the length of the integration.

In one embodiment, the imager may comprise a focal plane array having a plurality of pixels of the type illustrated in FIG. 2. The pixels, configured to detect different ranges in the SWIR spectrum, may differ in their respective filters 208. For example, a first subset of the pixels of the focal plane array may each have a filter 208 while a second subset of the pixels of the focal plane array may each have no filter. As another example, a first subset of the pixels of the focal plane array may each have a filter 208 of a first composition (e.g., a silicon-germanium alloy with a first ratio of silicon to germanium) and a second subset of pixels of the focal plane array may each have a filter 208 of a second composition (e.g., a silicon-germanium alloy with a second ratio of silicon to germanium).

The filters in the first subset may absorb a first range of wavelengths within the SWIR spectrum (e.g., wavelengths from 1.0 to 1.4 microns), thereby preventing the photodetectors 206 of these pixels from detecting the first range of wavelengths so that they only receive and detect a second range of wavelengths in the SWIR spectrum (e.g., 1.4 to 1.6 microns). Similarly, the filters in the second subset of pixels may absorb a third range of wavelengths in the SWIR spectrum (e.g., wavelengths from 1.0 to 1.2 microns), thereby preventing the photodetectors 206 of these pixels from detecting the third range of wavelengths so that they only receive and detect a fourth range of wavelengths in the SWIR spectrum (e.g., 1.2 to 1.6 microns). As should be appreciated, the outputs of the two subsets of pixels provide information relating to two different ranges of wavelengths in the SWIR spectrum (i.e., the second and fourth ranges of wavelengths), and can be processed to form an image that differentiates between, or otherwise represents, these two different ranges.

From this non-limiting example, it should be appreciated that an imager may be constructed which detects, and can produce an image differentiating between, any number of ranges of wavelengths in the SWIR spectrum (e.g., by including pixels with differing filter compositions). For example, a focal plane array may comprise three subsets of pixels. The pixels of the first subset may each include a filter 208 of a first composition, while the pixels of the second subset each include a filter 208 of a second composition, and the pixels of the third subset each include a filter 208 of a third composition. An image produced from such an imager may differentiate, or otherwise provide information relating to, the three different ranges of wavelengths detected by the different subsets of pixels.

Figure 7:
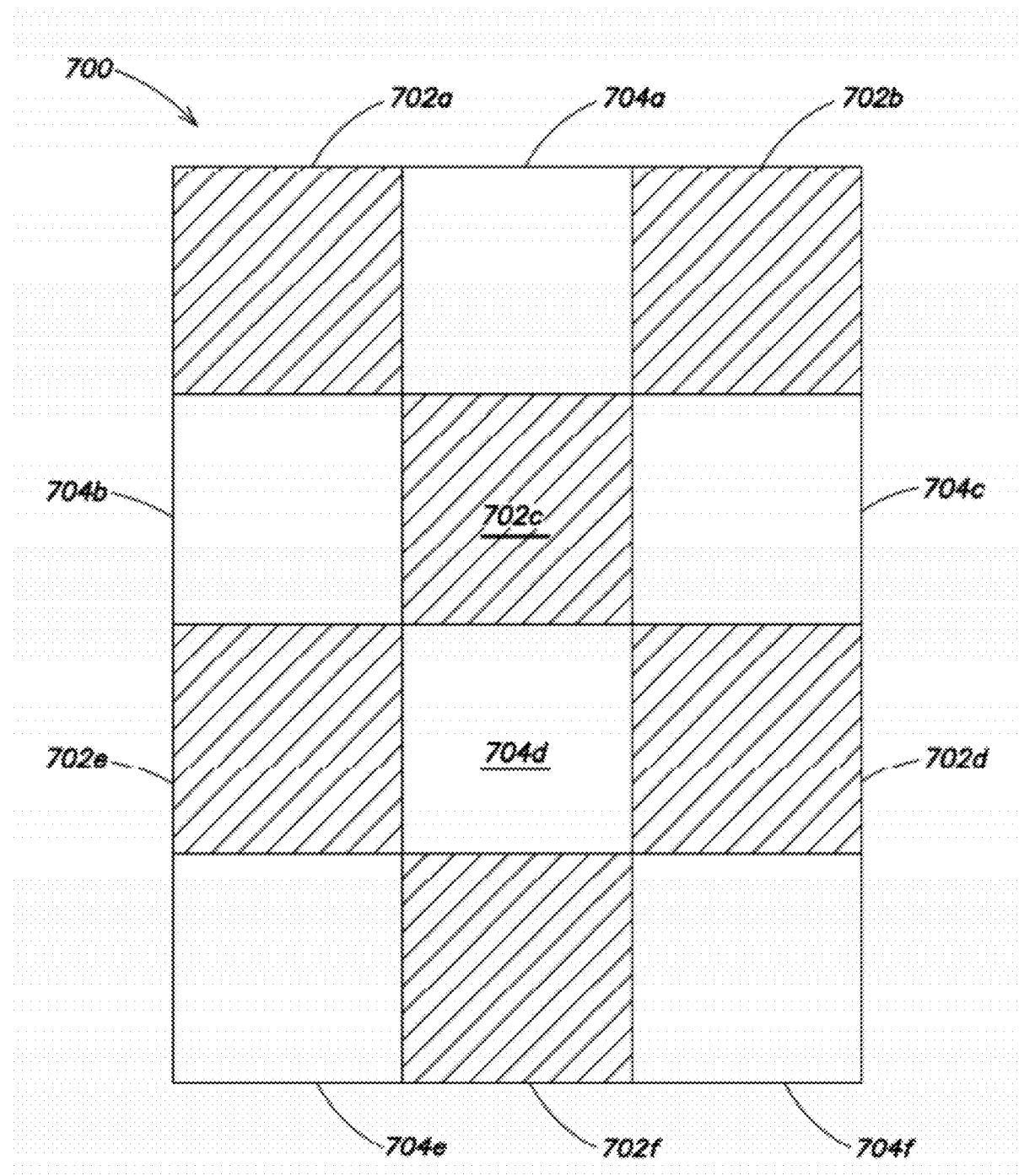
FIG. 7 illustrates a focal plane array having two different types of pixels capable of detecting different wavelengths of incident radiation, according to one embodiment.

FIG. 7 illustrates one non-limiting example of a focal plane array 700 of a SWIR imager according to an aspect of the invention, and can be used in an imager having a configuration like that shown in FIG. 6. As shown, the focal plane array 700 comprises pixels of two different types, namely pixels 702a-702f and 704a-704f. Pixels 702a-702f may each detect a first range of wavelengths, while pixels 704a-704f may each detect a second range of wavelengths in the SWIR spectrum. This can be done in any suitable way, as the aspects of the invention relating to a SWIR imager are not limited to any particular techniques for forming the pixels. For example, pixels 702a-702f may each have a structure similar to that of pixel 200 in FIG. 2, but without the filter 208, such that all radiation in the SWIR spectrum incident upon each pixel of pixels 702a-702f reaches the photodetector of the pixel. Pixels 704a-704f may each have a structure like that of pixel 200 in FIG. 2, including the filter 208. Therefore, each pixel of pixels 704a-704f may detect only a subset of radiation in the SWIR spectrum (which may be any desired range in the SWIR spectrum), thus functioning differently from the pixels 702a-702f.

The relative number and arrangement of pixels illustrated in FIG. 7 is not limiting, and may be altered to provide desired image characteristics. For example, the focal plane array 700 is shown as comprising an equal number of the two pixel types (i.e., pixels 702a-702f and pixels 704a-704f). However, it should be appreciated that more pixels of one type could be used in the focal plane array for any number of reasons. Similarly, the arrangement of the pixels is non-limiting.

While pixels 702a-702f and 704a-704f are arranged in a checkerboard pattern, any arrangement may be used. For example, the focal plane array 700 could be divided into two halves, with one half containing all the pixels of a first type (e.g., pixels 702a-702f) and the other half containing all the pixels of a second type (e.g., pixels 704a-704f). Other configurations are also possible.

An image may be produced by processing the output signals of the pixels 702a-702f and 704a-704f in any suitable manner, as the aspects of the invention relating to a SWIR imager are not limited in this respect. For example, it may be desirable for an image produced by an imager comprising the focal plane array 700 to provide information about both the first and second ranges of detected wavelengths at each pixel location. In other words, it may be desirable for each pixel (e.g., pixel 702a) to be assigned a value corresponding to both the first range of wavelengths and the second range of wavelengths. The pixel 702a detects the first range of wavelengths, which detection may provide a directly measured value assigned to that pixel for the first range. However, the pixel 702a does not detect the second range of wavelengths, such that, without some processing, pixel 702a may represent a "missing data point" with respect to the second range of wavelengths. As mentioned, to form a complete image, it may be desirable to assign a value to pixel 702a corresponding to the second range of wavelengths, i.e., to fill in the "missing data point." This can be done in any suitable manner.

Interpolation is one illustrative technique for assigning to a pixel a value corresponding to a range of wavelengths it does not detect. As an example, pixel 702c is of the first type, and therefore detects the first range of wavelengths. The output signal from pixel 702c therefore corresponds to detected radiation only in the first range, and may not provide any information about radiation in the second range. However, a value corresponding to the second range of wavelengths may be assigned to pixel 702c by averaging the value of the output signals detected by pixels 704a, 704b, 704c, and 704d, that are disposed adjacent and around pixel 702a and which each detects the second range of wavelengths. Similarly, a value representing the first range of wavelengths may be assigned to pixel 704d (which does not detect the first range of wavelengths within the SWIR spectrum) by averaging the values of the signals detected by pixels 702c, 702d, 702e, and 702f, which are disposed adjacent and around pixel 704d and do detect the first range of wavelengths. This interpolation technique is provided merely for purposes of illustration, as other techniques may alternatively be used to fill in the missing data points of the focal plane array, as the aspects of the invention relating to a SWIR imager are not limited to any particular technique for doing so.

In addition, it should be appreciated that the interpolation can take place at any suitable stage of the image processing. In other words, the "missing" data points may be filled in by assigning values to the pixels, as just described above, at any point in the digital imaging signal chain. For example, the values may be assigned on the imaging chip itself. The values may be assigned in a camera in which the imaging array is contained, or outside of the camera. The values may be assigned after transmission and before storage of the signals, or just prior to being sent to a display device. The methods of interpolation described herein are not limited to being implemented at any particular stage in the digital signal processing chain.

Various types of images may be produced using an imager with pixels that detect different bands in the SWIR spectrum (e.g., a focal plane array 700). For example, an imager can be used to produce separate images representing the different wavelengths detected by the different types of pixels. To do so, a single frame can be taken as it is not necessary to place different bulk filters in front of the focal plane array to detect radiation in different bands. When a focal plane array (e.g., like array 700) is employed wherein a subset of the pixels detect only a subset of the wavelengths in the SWIR spectrum (e.g., pixels 702a and detect the first band or range), missing data points for the other pixel locations (e.g., pixels 704a-704f) could be filled in (e.g., using interpolation as described above or any other suitable technique) to create a full final image representing the first range of wavelengths. Similarly, a full final image representing the second range of wavelengths detected by the second type of pixel 704a-704f may also be created. Each of the images of a subset of the SWIR spectrum may be valuable by itself, and may be used separately.

Figures 8, 9:
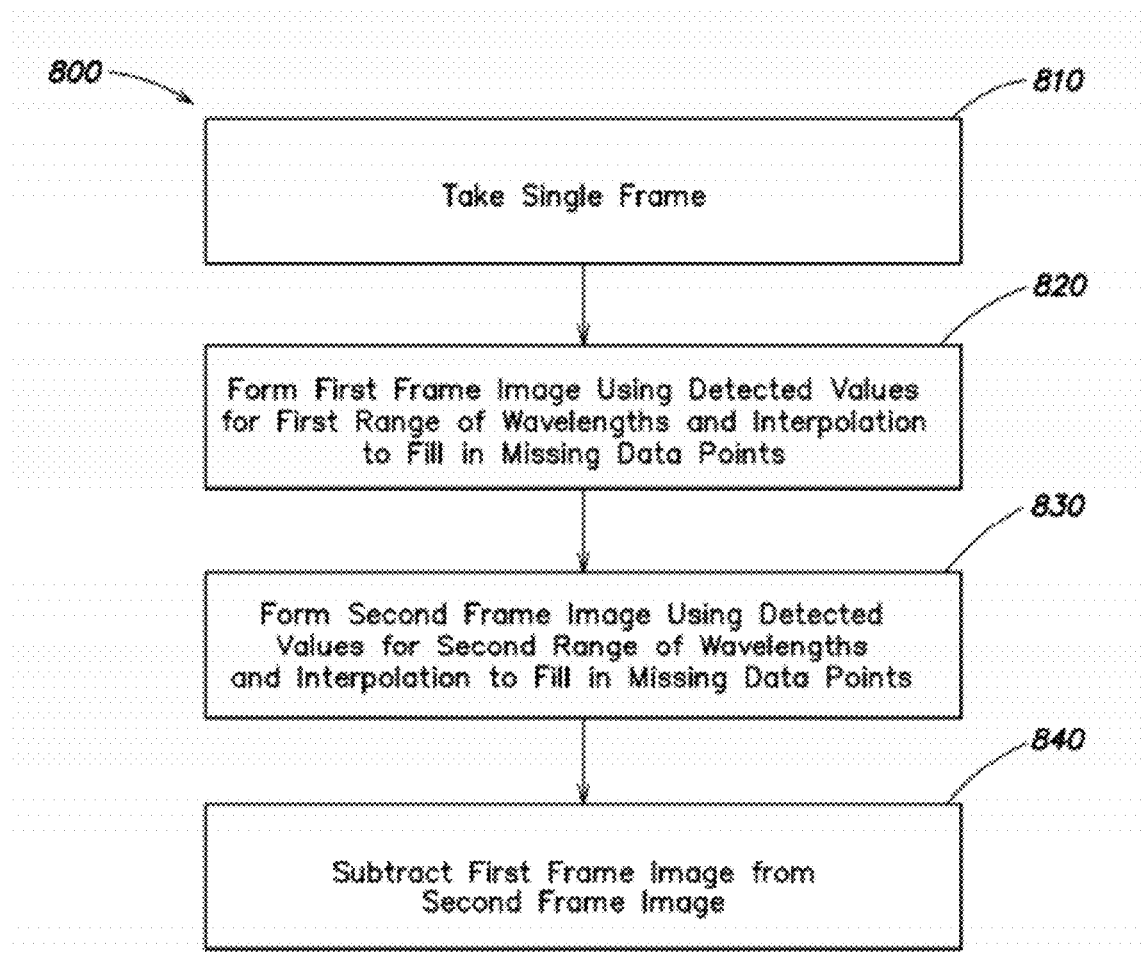
FIG. 8 is a flowchart illustrating a method of forming an image from an imager having two different types of pixels capable of detecting different wavelengths of incident radiation, according to one embodiment.
FIG. 9 illustrates a focal plane array with three different types of pixels capable of detecting different wavelengths of incident radiation, according to another embodiment.

In an alternate embodiment, a single image representing multiple ranges of wavelengths (e.g., the first and second ranges in the example above) in the SWIR spectrum may be provided using an imager of the type described above (e.g., via an imager having a focal plane array like that shown in FIG. 7). This can be done in any suitable way, as the aspect of the invention that relates to creating an image representing multiple bands in the SWIR spectrum is not limited to any particular technique. FIG. 8 illustrates one illustrative technique for accomplishing this. The method 800 begins at 810 by taking a single frame using the imager (e.g., using focal plane array 700). Thus, some subset (e.g., half) of the output signals will correspond to pixels of the first type that detect the first range of wavelengths, while another subset (e.g., the other half) of the output signals will correspond to pixels of the second type that detect a second range of wavelengths. At 820, a first frame image is formed representing the first range of wavelengths, which may be accomplished by using the outputs of the pixels of the first type, filling in for missing data points at the locations of the pixels for the second wavelength (e.g., via interpolating), as previously described.

At 830, a second frame image is formed representing the second range of wavelengths, which may be accomplished by using the outputs of the pixels of the second type, as well as filling in for missing data points at the location of the pixels for the first wavelength. Therefore, at this stage of the process, two images have been formed, with one representing the first range of wavelengths and the other representing the second range of wavelengths.

At 840, a final image may be formed by processing the first frame image and the second frame image in combination. This may be done in any suitable manner. For example, the first frame image may be subtracted from the second frame image, thereby producing a final image that represents the differences between the first and second frame images. As an example, the first frame may represent wavelengths ranging from approximately 1.0-1.5 microns, while the second frame may represent wavelengths ranging from approximately 1.0-1.3 microns. Subtracting the first frame from the second frame highlights those objects within a scene that have substantially different reflectivities of wavelengths above and below approximately 1.4 microns, e.g., skin. Thus, an image formed in this manner may highlight skin (and therefore people) in the final image.

While subtraction is one method of processing the first and second frame images in combination, it should be appreciated that other techniques are also possible, as the formation of an image is not limited to any particular technique. For example, the first and second frame images may be added together, may be scaled in dependence on each other, averaged, or otherwise processed in combination.

As mentioned above, FIG. 7 illustrates merely one example of a focal plane array that can be used for a SWIR image in accordance with one embodiment of the invention, as numerous other configurations are also possible. For example, a focal plane array may comprise three (or more) different types of pixels, with each type of pixel detecting a different range of wavelengths within the SWIR spectrum. FIG. 9 illustrates an example of a focal plane array for an imager with pixels capable of detecting three distinct bands in the SWIR spectrum. The focal plane array 900 comprises three types of pixels, represented by pixel types A, B, and C. Each type of pixel may detect a different range of wavelengths within the IR (e.g., SWIR) and/or visible spectra. The ranges of wavelengths detected by the different types of pixels may overlap, or may be separate, as the aspect of the invention related to an imager comprising pixels that detect different ranges of wavelengths is not limited in this manner. Furthermore, the pixels may be arranged in any suitable pattern, as the pattern illustrated in FIG. 9 is merely a non-limiting example. A resulting image may be generated by processing the outputs of the pixels in the focal plane array 900 in any suitable manner.

According to one embodiment, the outputs of pixel types A, B, and C of the focal plane array 900 are used to create three distinct images; one for each range of wavelengths detected by each type of pixel. The three images may be used separately. The "missing" data points for each pixel are filled in using interpolation, as described above. However, other methods may also be used, as the various aspects of the invention are not limited in this respect.

In an alternative embodiment, the outputs of the pixel types A, B, and C of the focal plane array 900 are used to create a single final image representing the three different bands detected by the three pixel types. Again, the missing data points for each pixel may be filled in by interpolation, or by any other suitable method. The final image may be created by combining completed images relating to the three types of pixels, or by any other method.

Other arrangements and combinations of pixels are also possible. For example, while the three types of pixels A, B, and C can each detect a different range of wavelengths in the SWIR spectrum, other types of pixels may be combined in an imaging array. For example, one or more types of pixels of the three types of pixels (e.g., pixel types A and B) may detect different ranges of wavelengths in the visible spectrum, taking the form of a conventional CMOS pixel. The remaining type(s) of pixels (e.g., pixel type C) may detect a band of wavelengths within the SWIR spectrum. In this manner, conventional imager pixels may be integrated in an imaging array with pixels having SWIR filters of the type illustrated in FIG. 2. Other combinations of pixels are also possible.

The pixel types A, B, and C may be fabricated in any manner, such as those manners previously described, or any other manner. For example, an imaging pixel, such as pixel 200 in FIG. 3, comprising a filter for filtering wavelengths within the SWIR spectrum may be fabricated using conventional semiconductor materials already commonly used in CMOS fabrication. Furthermore, the filter may comprise polycrystalline or amorphous materials, therefore obviating any need for the typically strict processing procedures used to achieve highly crystalline structures. Because the filter 208 is integrated within the pixel 200, there is no need for moving components or bulk filters.

Dual Function Semiconductor Layer

According to another aspect of the invention, a semiconductor material is provided that performs the dual functions of operating as a filter (e.g., a SWIR filter) and a conductor. The conducting function of the semiconductor material may be used for a variety of purposes, examples of which are discussed below.

As shown in FIGS. 2 and 4, imager pixels may include various structures formed of metal portions, such as metallization layers, vias, or other interconnections. These metal structures may be used to interconnect components within the pixel, to interconnect multiple pixels, and/or to connect the pixels to other circuitry (e.g., of an imager). Some of these structures may be disposed between the photodetector of the pixel(s) and the source of incident radiation. Because metal is highly reflective of many wavelengths of radiation, using metal for these structures may undesirably reduce the amount of radiation reaching a photodetector of the pixel(s).

Applicants have appreciated that a conducting semiconductor material (formed as a layer or any other suitable structure) may be used to perform the conducting functions of some structures (e.g., within an imager or other device) typically formed by metal. For example, a semiconductor material suitably doped may operate as an interconnect, for example interconnecting electrical components of a pixel, an imager, or any other structure, and providing a conduction path therebetween. In this manner, the semiconductor material may be used to transmit electrical signals, such as input/output signals, clock signals, power, or any other types of electrical signals, between electrical components. Alternatively, the semiconductor material may be used as an electrically conducting structure other than an interconnect, such as, for example, an electrode, an electrical gate, or a field plate. In this manner, the semiconductor material may be configured to maintain a charge, or voltage, for example to generate an electric field for biasing other electrical components of a pixel, an imager, or other apparatus. By using a semiconductor material to perform electrical functions, the amount of metal used in a structure may be reduced.

According to some embodiments, a semiconductor material configured to operate as an electrical conductor may also operate as a filter. The semiconductor material may be substantially transparent to some range of wavelengths of incident radiation, while at the same time being formed to block, or filter, other wavelengths of incident radiation. The semiconductor material (in the form of a layer or any other suitable form) may, for example, block some range of wavelengths in the visible, near IR, and/or SWIR spectra, while passing other ranges of wavelengths in these spectra. For example, according to some embodiments, the semiconductor material may block at least some radiation having a wavelength greater than 700 nanometers, such as 5% of incident radiation having a wavelength greater than 700 nanometers, 25% of incident radiation having a wavelength greater than 700 nanometers, at least 50% of incident radiation having a wavelength greater than 700 nanometers, or any other suitable percentage. Additionally, the semiconductor material may be formed to block radiation having other wavelengths, for example greater than 800 nanometers, greater than 1 micron, or any other suitable wavelength ranges. According to some embodiments, the semiconductor material may block at least some (e.g., 5%, 25%, at least 50%, or any other suitable percentage) incident radiation in the SWIR spectrum, for example having an upper cutoff wavelength of approximately 1.1 microns, 1.2 microns, 1.3 microns, or any other wavelength in the SWIR spectrum. It should be appreciated, however, that the various embodiments described herein as relating to an electrically conducting semiconductor material that also operates as a filter are not limited to filtering any particular range, or percentage, or wavelengths of incident radiation.

According to an aspect of the invention, an apparatus (e.g., an imager or an imager pixel) comprises a photodetector and an electrically conducting filter that is disposed between the photodetector and an imaging side of the apparatus such that at least some radiation incident on the apparatus passes through the filter to reach the photodetector. For example, according to one embodiment, an imaging pixel comprises a plurality of electrical components comprising a photodetector, and a filter formed at least partially from a semiconductor material, for example as a semiconductor layer. The electrical components may include signal input/output lines, clock signal lines, power supplies, power supply lines, capacitors, and/or any other suitable electrical components, of which the photodetector may be one. The semiconductor material of the filter may be doped sufficiently, both in type and amount, to operate as an electrical conductor. Thus, the semiconductor material of the filter may provide a conduction path which may interconnect one or more of the electrical components within the pixel or components of neighboring pixels. Thus, electrical signals, such as input and/or output signals of the photodetector and/or other electrical components of the pixel may be transmitted through the semiconductor material of the filter. As a result, the conducting functionality of the filter may reduce an amount of metal used for interconnections in and/or between pixels. In addition, in some embodiments, the filter may absorb some range of wavelengths within the visible and/or IR spectra, while passing other wavelengths within the visible and/or IR spectra. For example, the filter may absorb any of the ranges of wavelengths previously described herein, such as wavelengths greater than 700 nanometers, 800 nanometers, ranges of wavelengths having an upper wavelength cutoff in the SWIR spectrum, or any other suitable wavelengths.

Figure 10A:
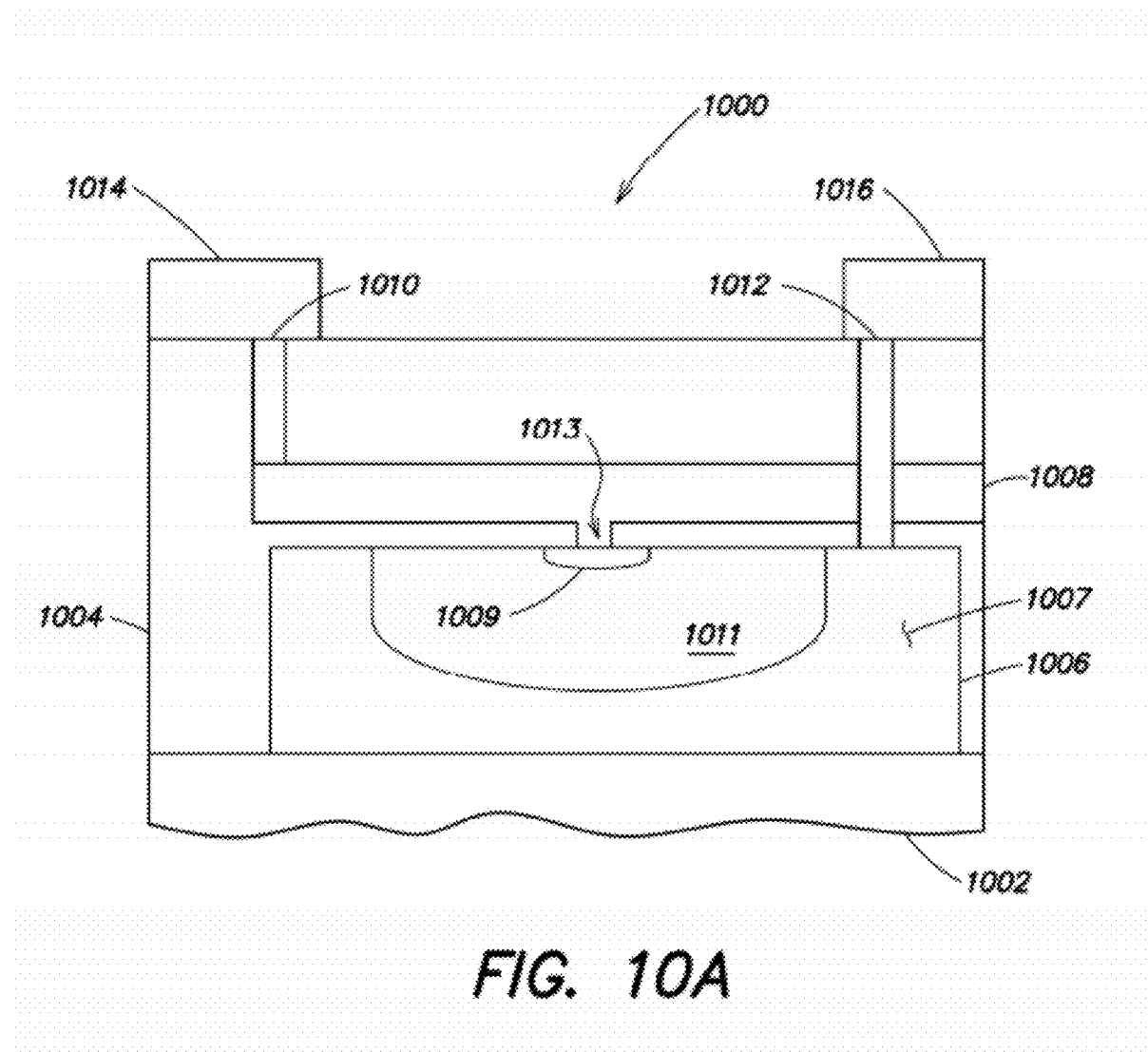
FIGS. 10A and 10B illustrate a cross-section and top-down view, respectively, of a pixel structure having a dual-function semiconductor layer, according to one embodiment.
Figure 10B:
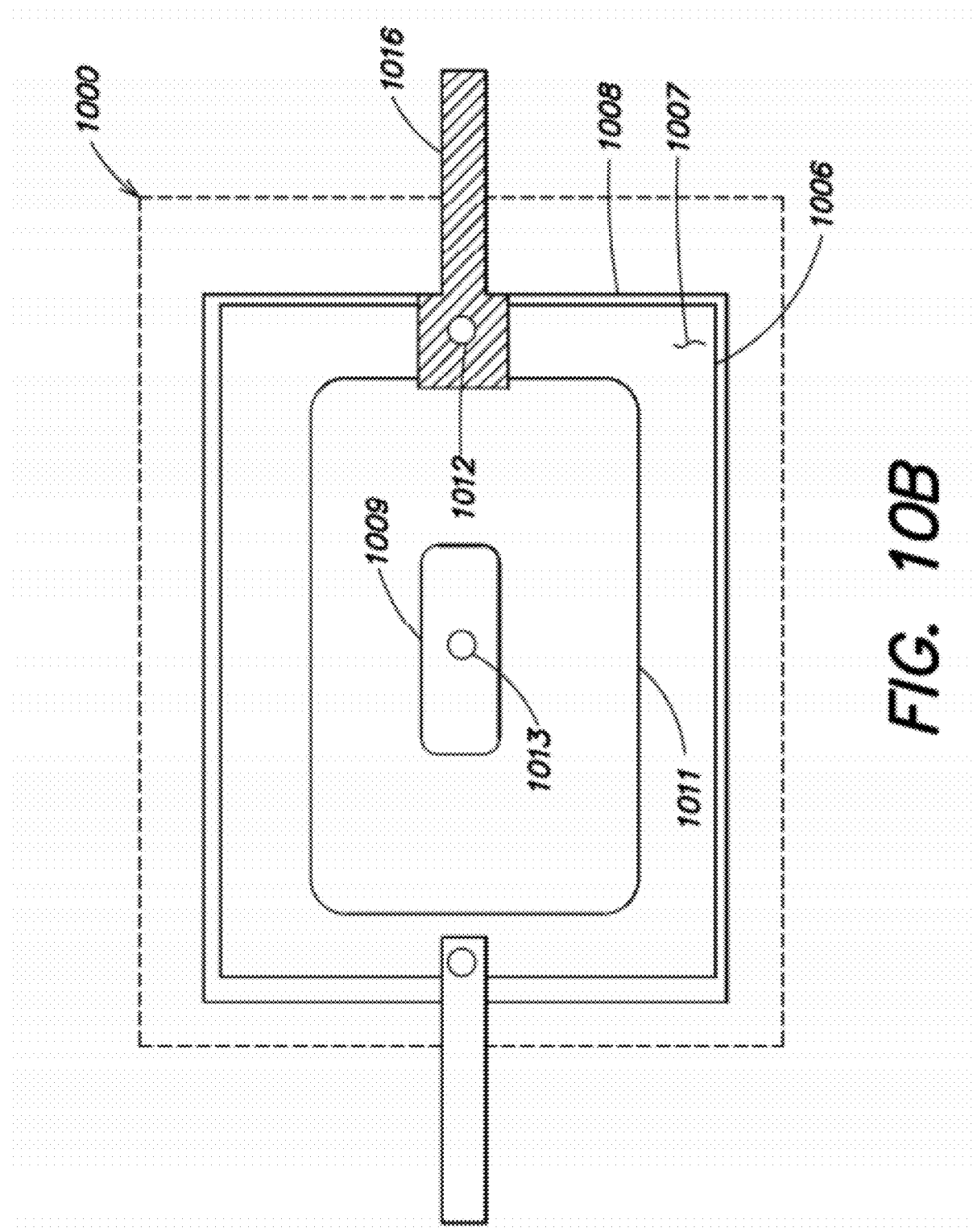

FIGS. 10A and 10B illustrate an example of a pixel 1000 which may include a dual-function semiconductor layer. As shown in FIG. 10A, pixel 1000 comprises a photodetector 1006 and a semiconductor layer 1008, which may be a dual-function semiconductor layer. The photodetector 1006 may be formed in a dielectric layer 1004, which may be on a substrate 1002. The photodetector may be configured to detect any desired wavelength ranges of incident radiation, and therefore may be formed from any suitable material and may have any suitable configuration. In the non-limiting example of FIG. 10A, the photodetector 1006 comprises a cathode 1009, which may be formed by suitable dopant implantation (or otherwise), and an anode 1007 which may similarly be formed by any suitable method. In one embodiment, the photodetector 1006 may be formed of a lightly dope p-type material, and therefore the positioning of the anode 1007 and cathode 1009 may leave a lightly doped p-type region 1011.

The semiconductor layer 1008 may be configured, in both size and positioning, to filter at least some radiation incident on the pixel 1000 from reaching the photodetector 1006. Thus, it should be appreciated that no particular positioning of the semiconductor layer 1008 is limiting, as various positions may be suitable for the semiconductor layer to be in the path of radiation incident on the pixel that reaches the photodetector. In one embodiment, suitable selection of the material of semiconductor layer 1008 allows for the semiconductor layer 1008 to operate as a filter, such as an absorption filter or any other suitable type of filter. For example, the semiconductor layer 1008 may comprise any material (examples of which are previously described herein) suitable for operating as a SWIR filter, such as a silicon-germanium alloy, or any other suitable material. However, the semiconductor layer 1008 is not limited to any particular material.

In addition, the semiconductor layer 1008 may be doped to operate as an electrical conductor, for example to read out photodetector output signals from the photodetector 1006 indicative of an amount of radiation incident on the photodetector. For example, the semiconductor layer 1008 may be doped with boron, phosphorous, or any other suitable dopant in any suitable concentration, such as $0.1 \times 10^{19}$ dopants/cm$^3$, $1 \times 10^{19}$ dopants/cm$^3$, $5 \times 10^{19}$ dopants/cm$^3$, or any other suitable doping concentration. The semiconductor layer 1008 may be formed to include a portion 1013 directly contacting the cathode 1009, as shown, so that the semiconductor layer 1008 may operate as an interconnection, through a first contact 1010 and metal 1014, between the photodetector 1006 and other components of the pixel or components in neighboring pixels.

The pixel 1000 further comprises a first contact 1010 and a second contact 1012, which may provide contact to the cathode and anode of the photodetector 1006, respectively. In the illustrated example, the first contact 1010 is connected to the semiconductor layer 1008, which, as mentioned, is connected to the cathode 1009 by portion 1013. A metallization line 1014 may be provided to contact the first contact 1010. Similarly, a metallization line 1016 may be provided to contact the second contact 1012. The contacts and the metallization lines may be formed of any suitable material, or materials, as the specific material(s) used is non-limiting. For example, the contacts 1010 and 1012 may be formed of tungsten or any other suitable material. The metallization lines 1014 and 1016 may be formed of aluminum, or any other suitable material.

FIG. 10B illustrates a top-down view of the pixel 1000 of FIG. 10A. In the non-limiting example of FIG. 10B, the semiconductor layer 1008 is sized and positioned to cover substantially all of the photodetector 1006. However, other configurations are possible. For example, the semiconductor layer 1008 may only cover a portion of the photodetector 1006 (e.g., 10% of the photodetector, 25% of the photodetector, greater than 50% of the photodetector, or any other percentage of the photodetector), and therefore may have a surface area substantially less than the surface area of the photodetector 1006. Other configurations are also possible.

In one embodiment, the filter 1008 may include a hole to allow contact 1012 to interconnect the photodetector anode 1007 and the metallization line 1016. In another embodiment, such as that shown in FIG. 10A, no hole is provided in the filter 1008 to contact the cathode 1009 because the filter 1008 itself provides electrical contact to the cathode.

FIGS. 11A-11H illustrate one non-limiting example of a process sequence for forming the pixel illustrated in FIGS. 10A-10B. The illustrated process focuses on the method of making the photodetector 1006 and filter 1008, so that some components of the pixel 1000 (e.g., the substrate, the dielectric layer 1004, etc.) are omitted.

Figure 11A:
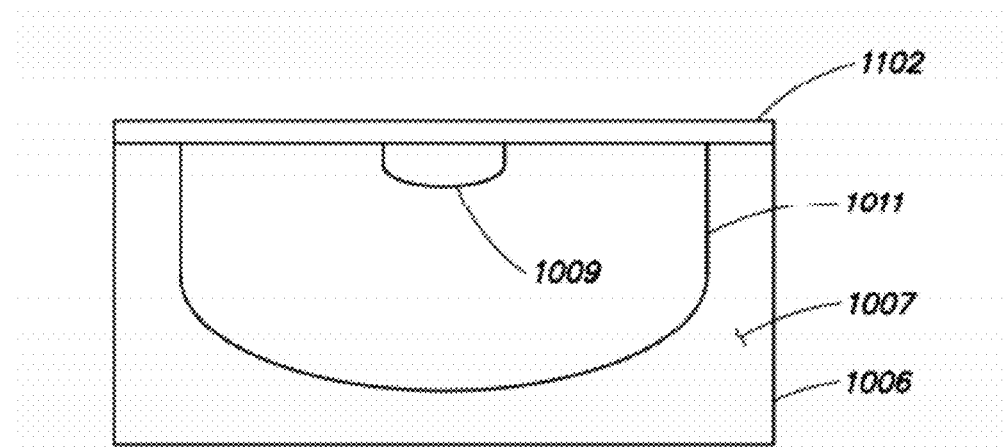
FIGS. 11A-11H illustrate a process sequence for making the pixel of FIG. 10A.

As shown in FIG. 11A, photodetector 1006 comprises an anode 1007 and a cathode 1009. The anode may be highly doped p-type and may be formed by any suitable process. The cathode 1009 may be highly doped n-type and may be formed by any suitable process. The photodetector 1006 may comprise a lightly doped p-type material, such that the positioning of the anode 1007 and the cathode 1009 may leave a lightly doped p-type region 1011. A passivation dielectric layer 1102 may be formed on the photodetector 1006 by any suitable process, such as by deposition.

Figure 11B:
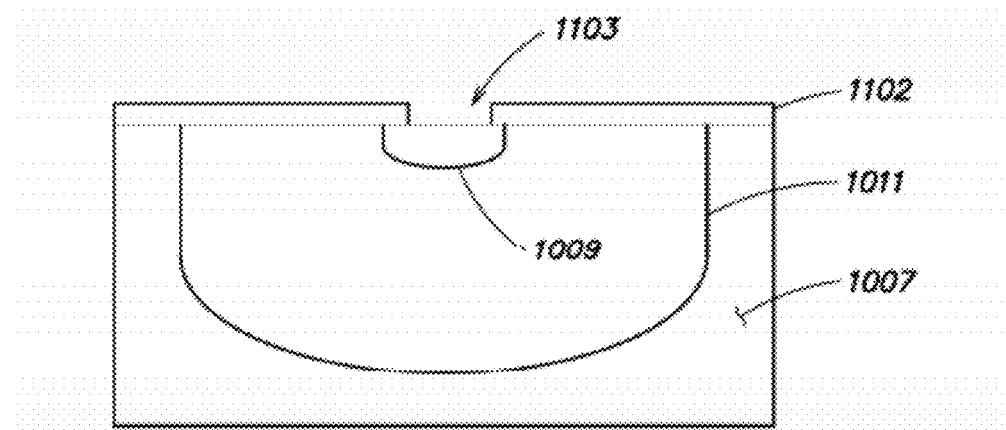
Figure 11C:
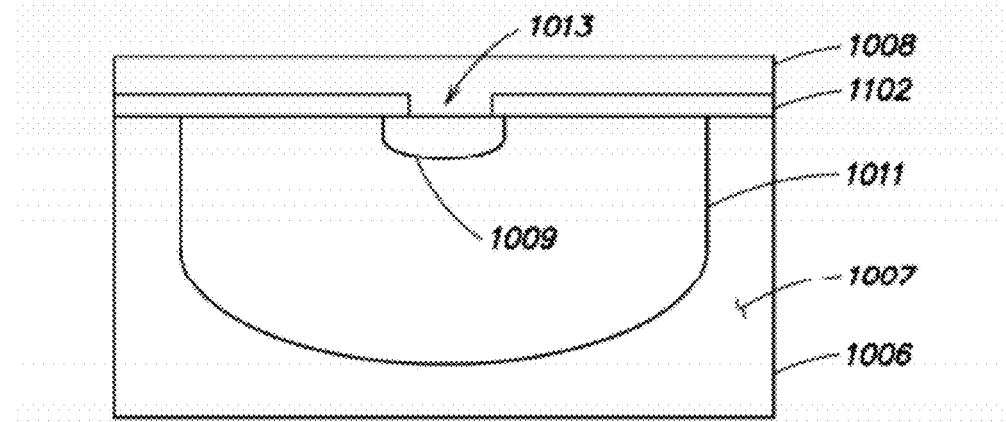

As shown in FIG. 11B, the passivation dielectric layer 1102 may be patterned, for example by etching, to open a window 1103 in the passivation layer 1102 to facilitate contact of the filter 1008 to the cathode 1009. In FIG. 11C, the filter 1008 is formed by deposition, or any other suitable process. The filter 1008 fills the window 1103 with a portion 1013 which makes direct contact to the cathode 1009.

Figure 11D:
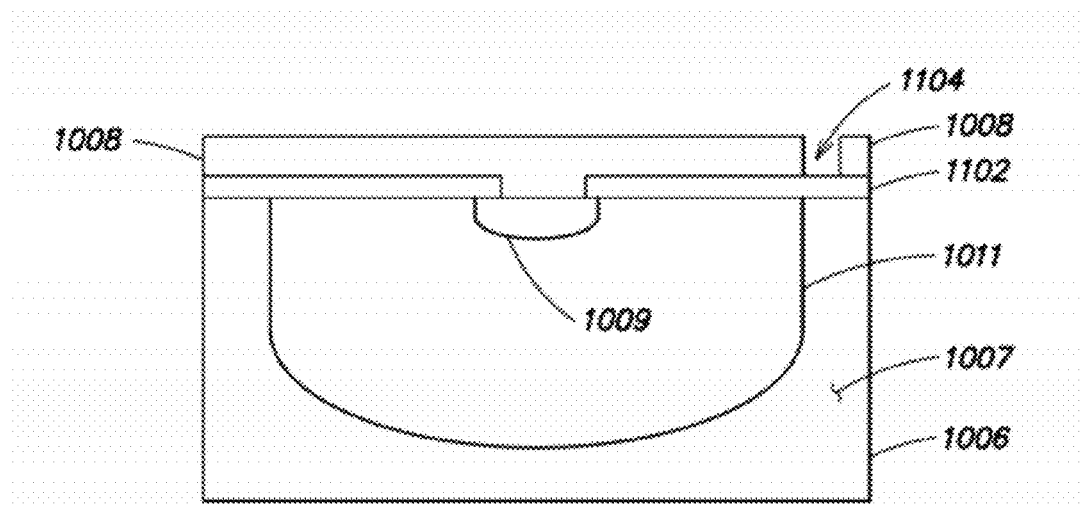
Figure 11E:
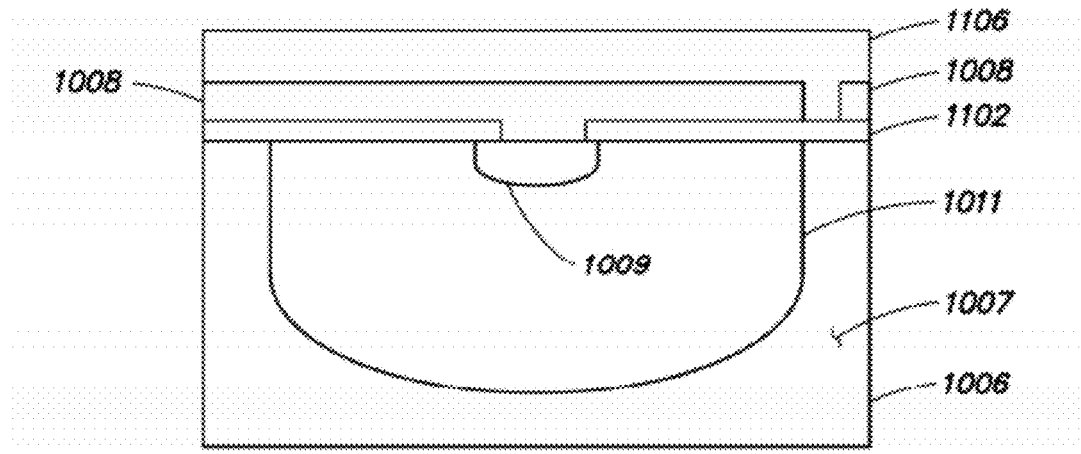

In FIG. 11D, the filter 1008 is patterned, for example by etching, to open a contact hole 1104 for the formation of a contact to the anode 1007 of the photodetector 1006. In FIG. 11E, a dielectric layer 1106 is deposited and fills the contact hole 1104. The dielectric layer 1106 may also be planarized, for example by CMP.

Figure 11F:
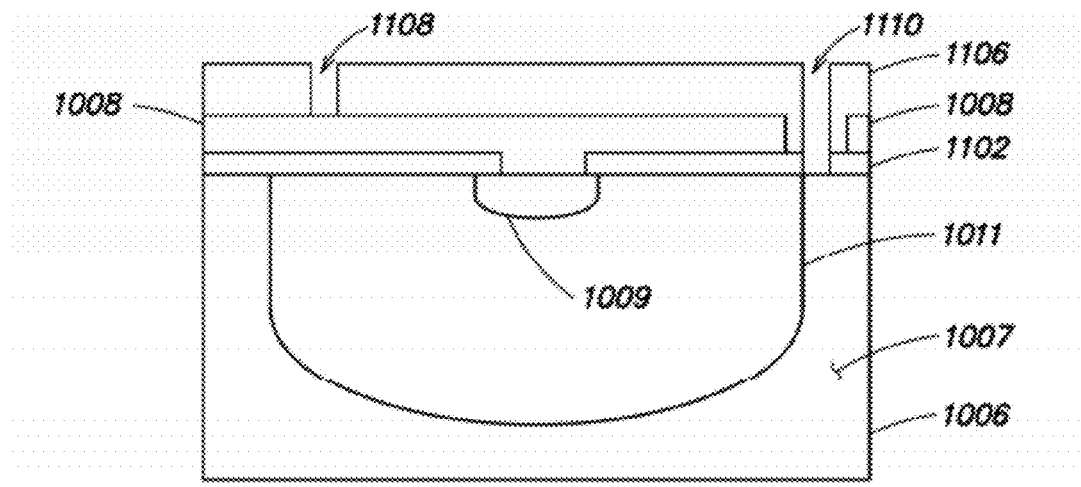
Figure 11G:
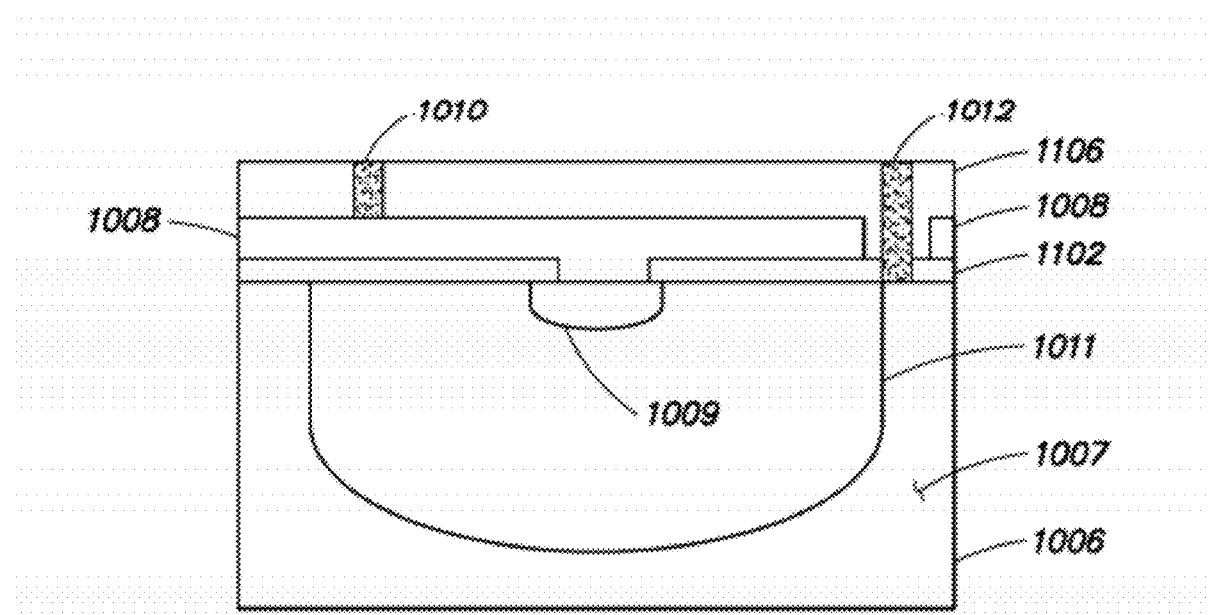
Figure 11H:
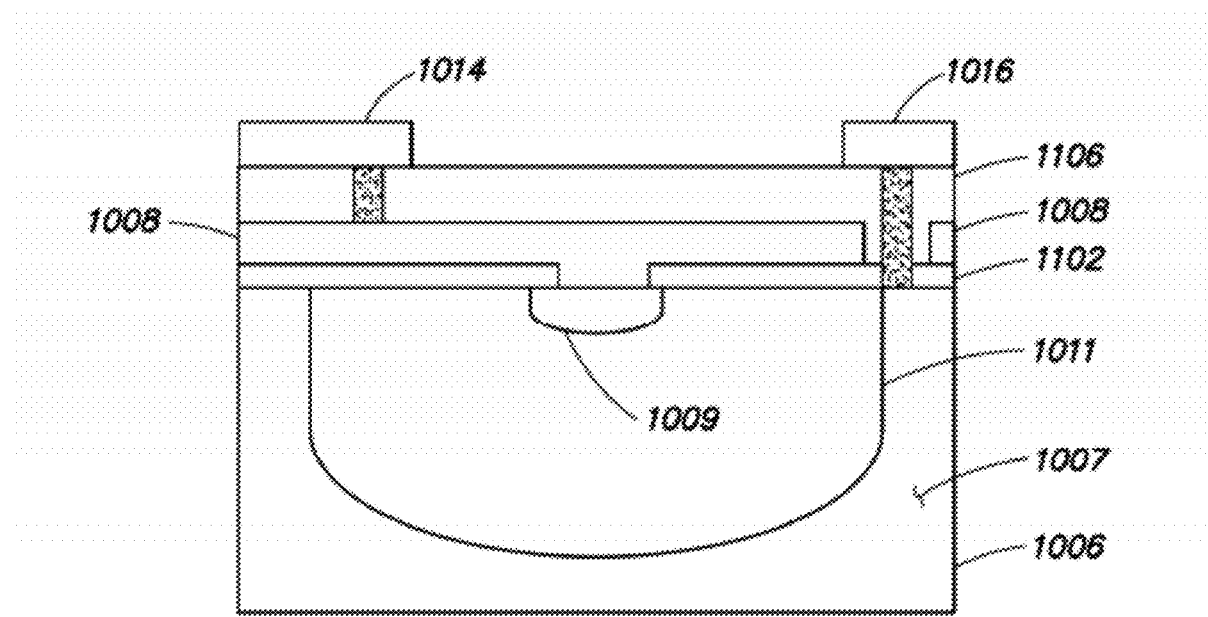

Next, as shown in FIG. 11F, the dielectric layer 1106 may be patterned to form contact holes 1108 and 1110 that provide contact to the filter 1008 and the anode 1007. The contact holes 1108 and 1110 may then be filled by deposition, as shown in FIG. 11G, with any suitable material for forming the first contact 1010 and the second contact 1012. In FIG. 11H, metallization lines 1014 and 1016 may be deposited and patterned.

Figure 14A:
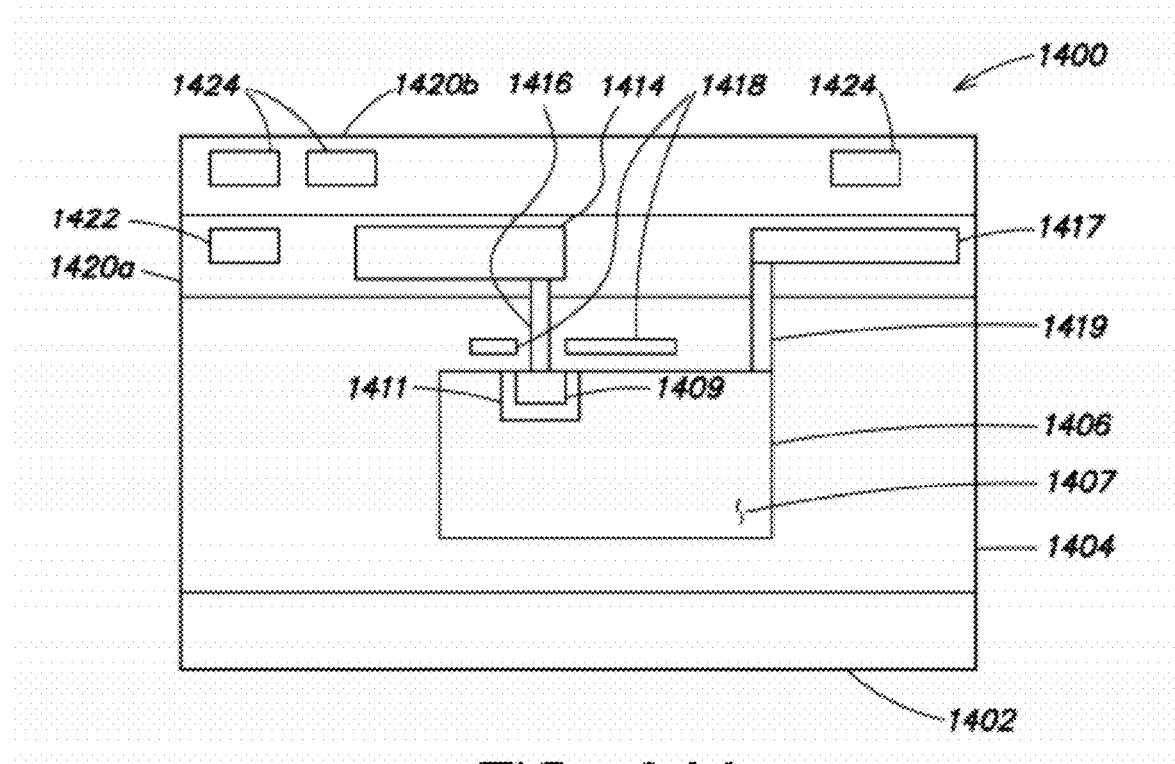
FIG. 14A-14B illustrate a cross-section and top-down view, respectively, of a pixel structure having a dual-function semiconductor layer, according to one embodiment.
Figure 14B:
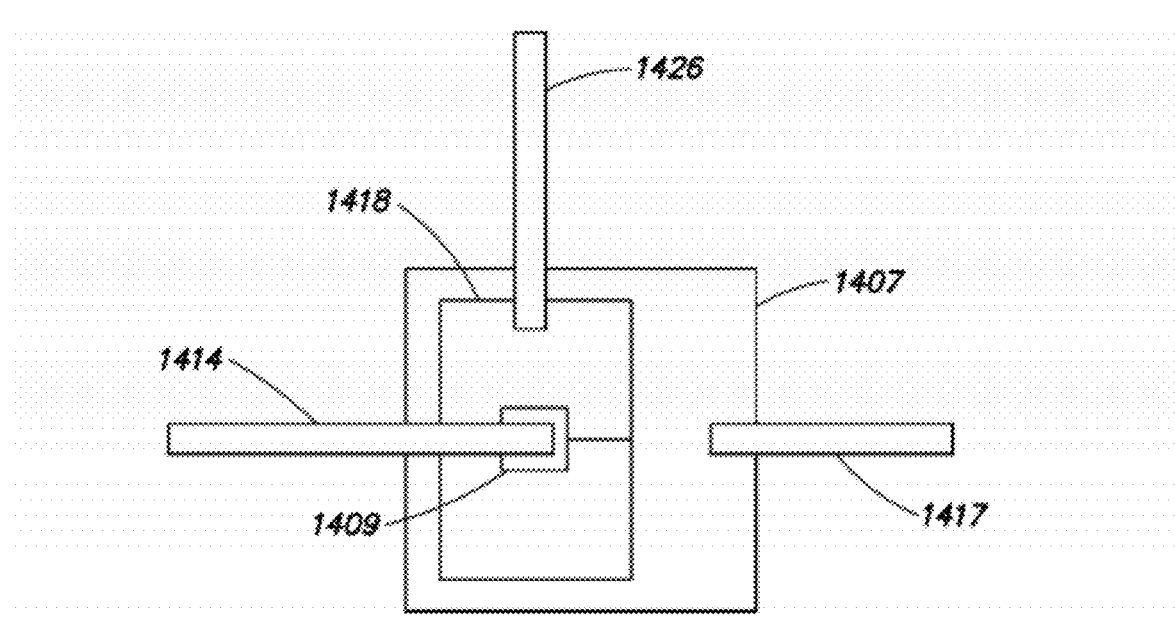

FIGS. 14A and 14B illustrate another structure including a semiconductor material which may operate as both a conductor and a filter. FIG. 14A shows a cross-section of a pixel 1400. A dielectric 1404 is formed on a substrate 1402, and a photodetector 1406 is formed in the dielectric. In the non-limiting example of FIG. 14A, the photodetector 1406 is a photodiode, having an anode 1407, a cathode 1409, and a depletion region 1411. Electrical contact is made to the cathode 1409 by a metallization layer 1414 and a via 1416. Electrical contact is made to the anode 1407 by metallization layer 1417 and via 1419.

The pixel 1400 further includes a gate 1418. The gate 1418 may be made of a semiconductor material, such as silicon, a silicon alloy, a silicon-germanium alloy, any material described previously for the formation of the filters described herein, or any other suitable material. The gate may partially block some incident radiation and pass some of the incident radiation, thereby operating as a filter. For example, the gate may be formed of a suitable thickness, as previously described in the context of the filter 208, to pass some wavelengths of radiation in the SWIR spectrum, or any other desirable wavelengths. Further, the gate 1418 may be doped (e.g., with a doping concentration of $0.1 \times 10^{19}$ dopants/cm$^3$, $1 \times 10^{19}$ dopants/cm$^3$, $5 \times 10^{19}$ dopants/cm$^3$, or any other suitable doping concentration) to be electrically conducting, thus providing a conduction path through which electrical signals may be transmitted.

According to one embodiment, the gate 1418 may be biased by a suitable voltage to operate as a field plate. For example, a bias signal may be applied to the gate 1418, by a voltage source or any other suitable bias signal source, so that the gate 1418 operates as a field plate relative to the photodetector 1406, for example by generating an electric field. The electric field generated by the field plate may bias the photodetector 1406, for example to minimize leakage current through the depletion region 1411 of the photodetector 1406. For example, as shown in FIGS. 14A-14B, the gate 1418 may be positioned over a photodiode to function as a gated photodiode having reduced leakage current through a depletion region of the photodiode. Alternatively, the gate may operate as a photo-gate to attract electrical carriers generated by radiation incident on a photodetector, such as photodetector 1406. The gate may be operated in a manner to allow separate readout from the photodetector 1406 of electrical carriers under the gate 1418 and those not under the gate 1418. For example, a voltage may be applied to the gate 1418 when reading out electrical carriers not under the gate 1418, and the voltage on the gate 1418 may then be turned off when reading out electrical carriers under the gate 1418. Other modes and methods of operation of the gate 1418 are also possible.

The pixel 1400 may further comprise backend dielectric layers 1420a and 1420b, similar to backend dielectric layers 210 and 212 described previously in connection with FIG. 2. The backend dielectric layers 1420a and 1420b may include metallization layers disposed therein, such as metallization layer 1422 in backend dielectric layer 1420a, and metallization layer 1424 in backend dielectric layer 1420b. It should be appreciated that the various aspects of the invention are not limited in this respect, as the backend dielectric layers are optional and need not be included.

FIG. 14B illustrates a top-down view of a portion of the pixel 1400 of FIG. 14A. As shown, the gate 1418 may be dimensioned to cover a substantial portion of the photodetector 1406 by covering a substantial portion of the anode 1407, such as approximately all of the anode. The gate 1418 in this non-limiting example includes a hole through which the via 1416 (shown in FIG. 14A) may pass to make contact between the metallization layer 1414 and the cathode 1409. The gate 1418 may be electrically contacted by a connection 1426, which may be formed of a metal or a conducting semiconductor layer, or any other suitable contacting structure. The connection 1426 may allow a bias signal (e.g., a bias voltage) to be applied to the gate 1418.

It should be appreciated that the dimensions of the gate 1418 illustrated in FIGS. 14A and 14B are non-limiting. For example, the thickness of the gate 1418, as shown in the cross-section view of the pixel 1400 in FIG. 14A, may have any suitable thickness to operate as a filter, such as a SWIR filter or a filter for any other wavelength ranges, as described previously herein. Similarly, the dimensions of the gate 1418 shown in FIG. 14B are non-limiting. The gate 1418 may be large enough to cover the entire anode 1407, or only a portion thereof. According to some embodiments, the gate 1418 may extend beyond the anode 1407 in FIG. 14B so that connection 1426 does not overlie any portion of the anode 1407. Other configurations are also possible, as the various aspects of the invention are not limited to any particular dimensions for the gate 1418.

As mentioned, the gate 1418 may be made of any suitable material and have any suitable dimensions. For example, the gate may be made of an amorphous, polycrystalline, or crystalline semiconductor material, as previously described with respect to filter 208 in FIG. 2 (e.g., silicon, a silicon alloy, SiGe, substantially pure Ge, or any other suitable material). The gate may have a thickness of 0.1 microns, 0.2 microns, or any other suitable thickness to allow desired wavelength ranges of incident radiation to pass through to photodetector 1406, while blocking other ranges of wavelengths of incident radiation from reaching the photodetector 1406.

It should be appreciated that the structures of FIGS. 10A-10B and 14 can be used in combination. For example, a gate formed of an electrically conductive semiconductor material may be included in a pixel together with electrically conducting semiconductor contacts to a photodetector in the pixel.

Having thus described several aspects of the invention, it is to be appreciated various alterations, modifications, and improvements will readily occur to those skilled in the art. Such alterations, modification, and improvements are intended to be part of this disclosure, and are intended to be within the spirit and scope of the aspects of the invention. Accordingly, the foregoing description and drawings are by way of example only.

What is claimed is:
1. An apparatus comprising:
   a plurality of pixels each configured to detect radiation incident thereon, the plurality of pixels configured to detect at least two different wavelength ranges of a short wavelength infrared spectrum, the plurality of pixels comprising:

a first pixel configured to detect a first range of wavelengths in the short wavelength infrared (SWIR) spectrum and produce a first photoresponse indicative of a quantity of radiation in the first range incident thereon; and a second pixel configured to detect a second range of wavelengths in the SWIR spectrum and produce a second photoresponse indicative of a quantity of radiation in the second range incident thereon, the second range differing from the first range; and readout circuitry configured to read out the first and second photoresponses, wherein the first pixel comprises a first photodetector and the second pixel comprises a second photodetector, and wherein each of the first and second photodetectors is capable of detecting a third range of wavelengths in the SWIR spectrum, the third range of wavelengths comprising the first range and the second range.

2. The apparatus of claim 1, wherein the apparatus further comprises a silicon substrate in or on which the plurality of pixels and the readout circuitry are formed, wherein the first photodetector and the second photodetector are monolithically integrated with the silicon substrate.

3. The apparatus of claim 2, wherein the first photodetector comprises germanium and the second photodetector comprises germanium.

4. The apparatus of claim 3, wherein the first pixel comprises a first filter configured to pass the first range of wavelengths, and wherein the second pixel comprises a second filter configured to pass the second range of wavelengths.

5. The apparatus of claim 4, wherein the first filter is an absorption filter configured to absorb at least some radiation in the third range that is not in the first range, and wherein the second filter is an absorption filter configured to absorb at least some radiation in the third range that is not in the second range.

6. The apparatus of claim 2, further comprising a processor coupled to the readout circuitry to produce an image from signals provided by the readout circuitry.

7. A semiconductor structure, comprising:

a substrate;

a photodetector comprising at least one semiconductor material, the photodetector formed on or at least partially in the substrate; and a semiconductor layer configured as a filter to block at least some radiation having a wavelength greater than 700 nanometers incident on the semiconductor structure from reaching the photodetector and doped to be electrically conducting.

8. The semiconductor structure of claim 7, wherein the semiconductor layer has a doping concentration of at least $0.1 \times 10^{19}$ dopants per cubic centimeter.

9. The semiconductor structure of claim 7, wherein the semiconductor layer contacts the photodetector.

10. The semiconductor structure of claim 7, wherein the semiconductor structure further comprises a dielectric material disposed between the photodetector and the semiconductor layer to prevent direct electrical contact between the semiconductor layer and the photodetector.

* * * * *